(12) United States Patent
Kang et al.

(10) Patent No.: US 12,727,476 B2
(45) Date of Patent: Sep. 1, 2026

(54) SEMICONDUCTOR PACKAGE

(71) Applicant: Samsung Electronics Co., Ltd., Suwon-si (KR)

(72) Inventors: Myungsam Kang, Hwaseong-si (KR); Yongjin Park, Yongin-si (KR); Youngchan Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 796 days.

(21) Appl. No.: 18/055,805

(22) Filed: Nov. 15, 2022

(65) Prior Publication Data

US 2023/0075027 A1 Mar. 9, 2023

Related U.S. Application Data

(63) Continuation of application No. 16/917,251, filed on Jun. 30, 2020, now Pat. No. 11,508,639.

(30) Foreign Application Priority Data

Oct. 22, 2019 (KR) ........................ 10-2019-0131418

(51) Int. Cl.
*H10W 40/22* (2026.01)
*H10P 72/70* (2026.01)
(Continued)

(52) U.S. Cl.
CPC ........... *H10W 40/228* (2026.01); *H10P 72/74* (2026.01); *H10W 40/22* (2026.01); *H10W 42/20* (2026.01);
(Continued)

(58) Field of Classification Search
CPC . H01L 23/3677; H01L 23/36; H01L 23/4334; H01L 23/5384; H01L 23/49816;
(Continued)

(56) References Cited

U.S. PATENT DOCUMENTS

| | | | |
|---|---|---|---|
| 7,880,297 | B2 | 2/2011 | Jao et al. |
| 9,337,073 | B2 | 5/2016 | Liu et al. |

(Continued)

FOREIGN PATENT DOCUMENTS

| | | | |
|---|---|---|---|
| KR | 20190107986 | A | 9/2019 |
| KR | 20200067658 | A | 6/2020 |
| TW | 201913920 | A | 4/2019 |

*Primary Examiner* — Marlon T Fletcher
*Assistant Examiner* — Christina A Sylvia
(74) *Attorney, Agent, or Firm* — Wolf, Greenfield & Sacks, P.C.

(57) ABSTRACT

A semiconductor package includes an interconnect structure having a first surface and a second surface opposing the first surface, and including a redistribution pattern and a vertical connection conductor, a first semiconductor chip disposed for a first inactive surface to oppose the first surface, a second semiconductor chip disposed on the first surface of the interconnect structure and disposed for the second inactive surface to oppose the first surface; a first encapsulant encapsulating the first and second semiconductor chips, a backside wiring layer disposed on the first encapsulant, a wiring structure connecting the redistribution pattern to the backside wiring layer, a heat dissipation member disposed on the second surface and connected to the vertical connection conductor.

20 Claims, 12 Drawing Sheets

(51) Int. Cl.

| | |
|---|---|
| ***H10W 42/20*** | (2026.01) |
| ***H10W 70/02*** | (2026.01) |
| ***H10W 70/05*** | (2026.01) |
| ***H10W 70/60*** | (2026.01) |
| ***H10W 70/65*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |
| *H10W 70/09* | (2026.01) |
| *H10W 70/652* | (2026.01) |

(52) U.S. Cl.

CPC ........... *H10W 70/02* (2026.01); *H10W 70/05* (2026.01); *H10W 70/093* (2026.01); *H10W 70/611* (2026.01); *H10W 70/614* (2026.01); *H10W 70/65* (2026.01); *H10W 70/685* (2026.01); *H10W 74/016* (2026.01); *H10W 74/019* (2026.01); *H10W 74/117* (2026.01); *H10W 90/00* (2026.01); *H10P 72/7436* (2026.01); *H10W 70/09* (2026.01); *H10W 70/6528* (2026.01)

(58) Field of Classification Search

CPC ..... H01L 23/13; H01L 23/04; H01L 23/3135; H01L 23/481; H01L 23/485; H01L 23/525; H01L 23/3128; H01L 23/367; H01L 23/5383; H01L 23/5386; H01L 23/5389; H01L 23/552; H01L 21/4853; H01L 21/4857; H01L 21/4871; H01L 21/565; H01L 21/568; H01L 21/6835; H01L 24/19; H01L 24/20; H01L 25/16; H01L 25/105; H01L 25/0655; H01L 2221/68372; H01L 2221/68345; H01L 2221/68359; H01L 2224/19; H01L 2224/214; H01L 2224/12105; H01L 2224/04105; H01L 2224/2518; H01L 2924/19106; H01L 2924/3025; H01L 2924/19041; H01L 2924/19042; H01L 2225/107; H01L 2225/1041; H10W 40/228; H10W 40/22; H10W 42/20; H10W 70/02; H10W 70/05; H10W 70/093; H10W 70/611; H10W 70/614; H10W 70/65; H10W 70/685; H10W 74/016; H10W 74/019; H10W 74/117; H10W 90/00; H10W 70/09; H10W 70/6528; H10W 72/241; H10W 72/9413; H10W 40/10; H10W 40/778; H10W 42/276; H10W 70/60; H10W 70/635; H10W 70/68; H10W 90/701; H10W 20/20; H10W 20/40; H10W 20/49; H10W 74/121; H10W 76/12; H10P 72/74; H10P 72/7436; H10P 72/7424; H10P 72/743

See application file for complete search history.

(56) References Cited

U.S. PATENT DOCUMENTS

| | | | |
|---|---|---|---|
| 9,831,170 | B2 | 11/2017 | Scanlan et al. |
| 10,170,410 | B2 | 1/2019 | Kim et al. |
| 10,217,631 | B2 | 2/2019 | Kim et al. |
| 2006/0220210 | A1 | 10/2006 | Karnezos et al. |
| 2009/0166849 | A1* | 7/2009 | Jao ...................... H01L 23/4334 257/E21.507 |
| 2010/0013087 | A1 | 1/2010 | England |
| 2012/0119380 | A1 | 5/2012 | Haba |
| 2012/0119388 | A1* | 5/2012 | Cho ...................... H01L 21/561 257/778 |
| 2012/0281113 | A1 | 11/2012 | Kennedy et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2013/0307143 | A1 | 11/2013 | Lin et al. |
| 2014/0134804 | A1 | 5/2014 | Kelly et al. |
| 2014/0185264 | A1 | 7/2014 | Chen et al. |
| 2016/0260684 | A1* | 9/2016 | Zhai .................... H01L 25/0652 |
| 2016/0276307 | A1* | 9/2016 | Lin ....................... H01L 23/562 |
| 2017/0005067 | A1 | 1/2017 | Yang et al. |
| 2017/0077022 | A1 | 3/2017 | Scanlan et al. |
| 2017/0098640 | A1 | 4/2017 | Liang et al. |
| 2017/0263518 | A1* | 9/2017 | Yu ........................... H01L 24/83 |
| 2018/0130761 | A1 | 5/2018 | Kim et al. |
| 2018/0233452 | A1 | 8/2018 | Lin et al. |
| 2018/0350747 | A1 | 12/2018 | Hwang et al. |
| 2019/0043771 | A1 | 2/2019 | Chang et al. |
| 2019/0067157 | A1 | 2/2019 | Lin et al. |
| 2019/0088621 | A1* | 3/2019 | Yang ................... H01L 25/0657 |
| 2019/0148304 | A1 | 5/2019 | Gavagnin et al. |
| 2019/0164892 | A1 | 5/2019 | Franz et al. |
| 2019/0287938 | A1 | 9/2019 | Kim et al. |
| 2020/0176391 | A1 | 6/2020 | Lim et al. |
| 2026/0033334 | A1* | 1/2026 | Lee ..................... H10W 40/228 |

* cited by examiner

SEMICONDUCTOR PACKAGE

CROSS-REFERENCE TO RELATED APPLICATION

This application is a continuation of and claims priority to U.S. patent application Ser. No. 16/917,251, now U.S. Pat. No. 11,508,639, filed Jun. 30, 2020, which claims benefit of priority to Korean Patent Application No. 10-2019-0131418 filed on Oct. 22, 2019, in the Korean Intellectual Property Office, the disclosures of which are incorporated herein by reference in their entireties.

FIELD

Example embodiments of the present inventive concepts relate to semiconductor packages.

BACKGROUND

Recently, interest in a system in package (SiP) semiconductor package requiring complexity and multifunctionality has increased. When a plurality of passive components are surface-mounted, together with semiconductor components, there may be limitations in reducing a gap between the components, and it may be difficult to emit heat generated by a semiconductor chip.

SUMMARY

Example embodiments of the present inventive concept provide a semiconductor package having a reduced size and having improved heat dissipation performance.

According to an example embodiment of the present inventive concept, a semiconductor package includes an interconnect structure having a first surface, a second surface opposing the first surface, a redistribution pattern, and a vertical connection conductor. A first semiconductor chip is on the first surface of the interconnect structure, and includes a first active surface, a first connection pad on the first active surface and connected to the redistribution pattern, and a first inactive surface opposing the first active surface, where the first active surface is facing the first surface. A second semiconductor chip is on the first surface of the interconnect structure, and includes a second active surface, a second connection pad on the second active surface, and a second inactive surface opposing the second inactive surface, where the second inactive surface is facing the first surface and is connected to the vertical connection conductor. A first encapsulant is on the first surface of the interconnect structure and is at least partially encapsulating the first semiconductor chip and the second semiconductor chip. A backside wiring layer is on the first encapsulant and connected to the second connection pad. A wiring structure is on the first surface of the interconnect structure and electrically connecting the redistribution pattern to the backside wiring layer. A heat dissipation member is on the second surface of the interconnect structure and connected to the vertical connection conductor. A second encapsulant is on the second surface of the interconnect structure and is at least partially encapsulating the heat dissipation member.

According to an example embodiment of the present inventive concept, a semiconductor package includes an interconnect structure having a first surface, a second surface opposing the first surface, and a redistribution layer. A first semiconductor chip includes a first active surface, a first connection pad on the first active surface, and a first inactive surface opposing the first active surface, where the first active surface is facing the first surface. A second semiconductor chip includes a second active surface, a second connection pad on the second active surface, and a second inactive surface opposing the second active surface, where the second inactive surface is facing the first surface. A first encapsulant is on the first surface of the interconnect structure and is at least partially encapsulating the first semiconductor chip and the second semiconductor chip. A passive component is on the second surface of the interconnect structure. A heat dissipation member is on the second surface of the interconnect structure. A second encapsulant is on the second surface of the interconnect structure and at least partially encapsulating the passive component and the heat dissipation member. An external shielding layer is on at least a portion of an exterior surface of each of the second encapsulant, the interconnect structure, and the first encapsulant. The redistribution pattern includes a redistribution pattern connecting the passive component to the first connection pad and a heat dissipation pattern connecting the heat dissipation member to the second inactive surface. An upper surface of the passive component is spaced apart from the external shielding layer, and an upper surface of the heat dissipation member is in contact with the external shielding layer.

According to an example embodiment of the present inventive concept, a semiconductor package includes an interconnect structure having a first surface and a second surface opposing the first surface. The interconnect structure further includes a redistribution pattern and a heat dissipation pattern physically that are spaced apart from each other. A frame is on the first surface of the interconnect structure, and includes a first through-hole, a second through-hole, and a wiring layer connected to the redistribution pattern. A first semiconductor chip is in the first through-hole, and includes a first active surface, a first connection pad on the first active surface and connected to the redistribution pattern, and a first inactive surface opposing the first active surface, where the first active surface is facing the first surface. A second semiconductor chip is in the second through-hole, and includes a second active surface, a second connection pad on the second active surface and electrically connected to the first connection pad, and a second inactive surface connected to the heat dissipation pattern and opposing the second active surface, where the second inactive surface is facing the first surface. A first encapsulant is on the first surface of the interconnect structure, and encapsulates at least a portion of each of the frame, the first semiconductor chip, and the second semiconductor chip. A backside wiring layer is on the first encapsulant and connected to at least one of the wiring layer or the second connection pad. A passive component is on the second surface of the interconnect structure and is connected to the redistribution pattern. A heat dissipation member is on the second surface of the interconnect structure and is connected to the heat dissipation pattern. A second encapsulant is on the second surface of the interconnect structure and encapsulates at least a portion of each of the passive component and the heat dissipation member. An external shielding layer is on at least a portion of an exterior surface of each of the second encapsulant, the interconnect structure, the frame, and the first encapsulant, and is in contact with an upper surface of the heat dissipation member. A passivation layer is on the first encapsulant and includes an opening that exposes at least a portion of the backside wiring layer. An electrical connector metal is on the passivation layer and is connected to the at least a portion of the backside wiring layer that is exposed by the opening.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings.

Figure 1:
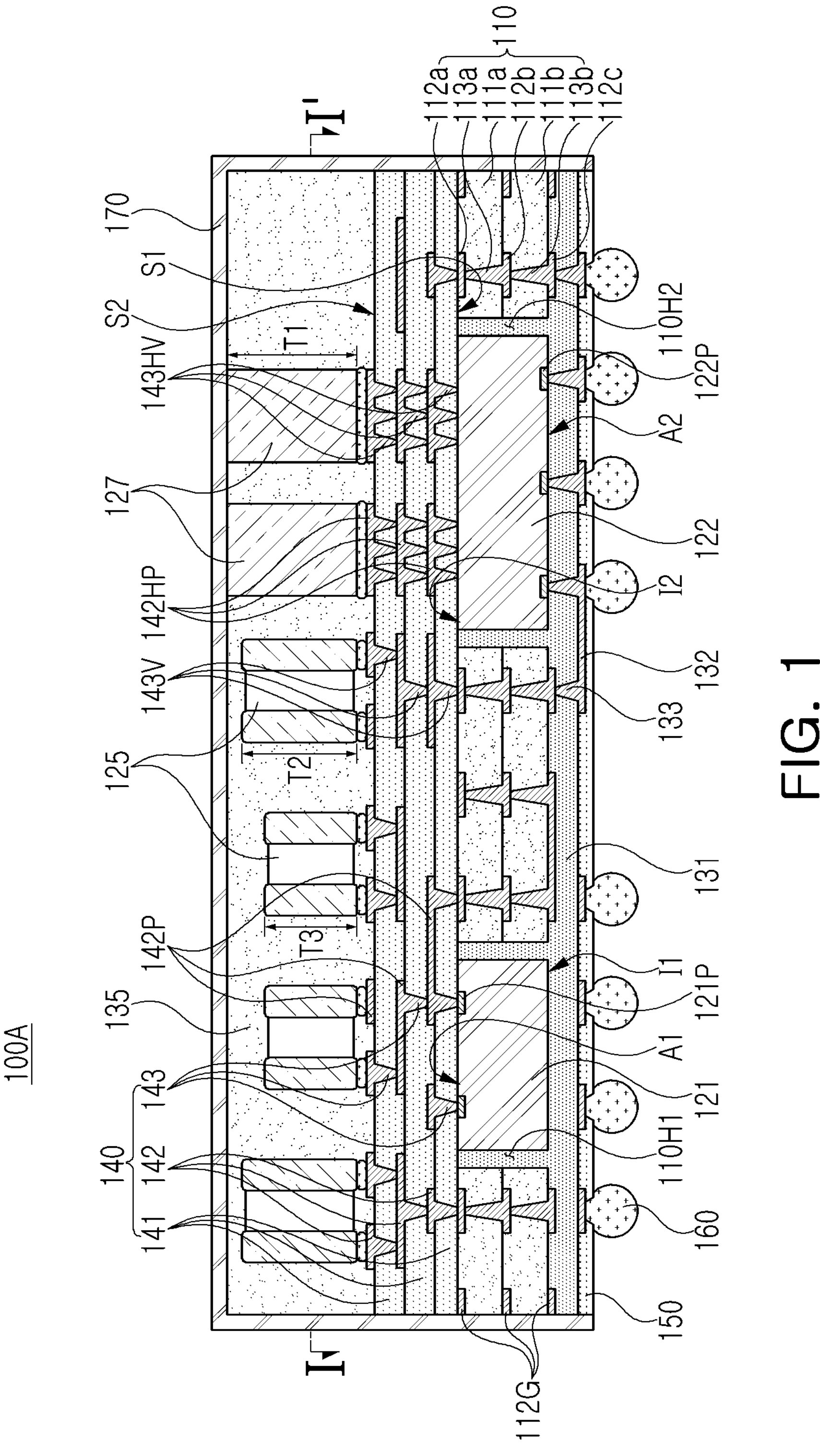
FIG. 1 is a cross-sectional diagram illustrating a semiconductor package according to an example embodiment of the present inventive concept.
Figure 2A:
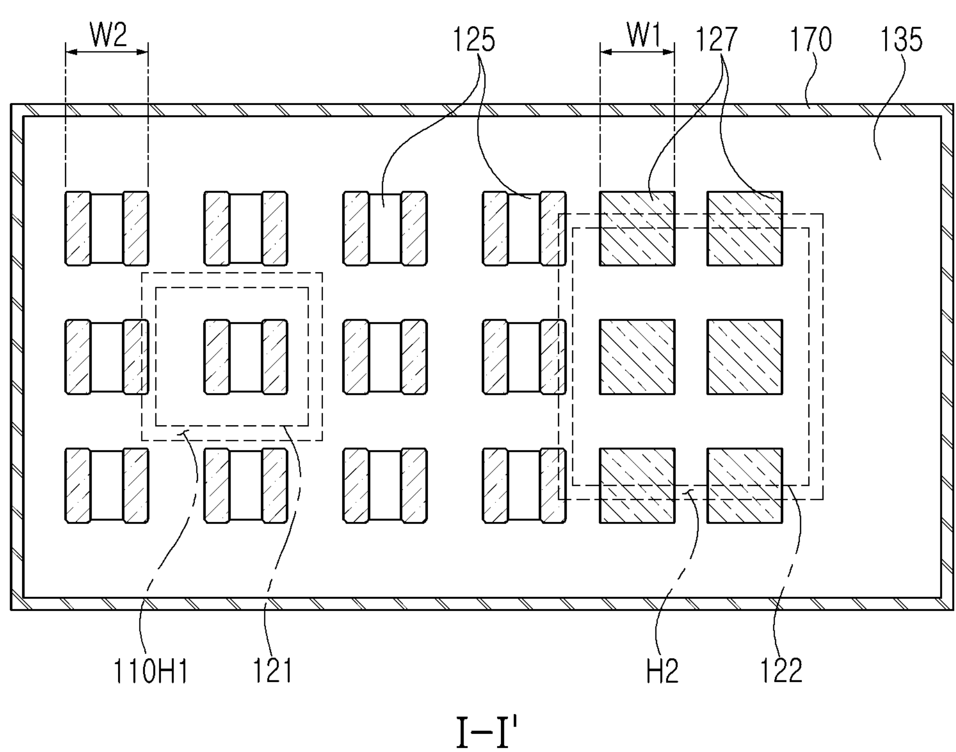
FIGS. 2A and 2B are cross-sectional plan diagrams illustrating the semiconductor package illustrated in FIG. 1 along line I-I' in FIG. 1.
Figure 2B:
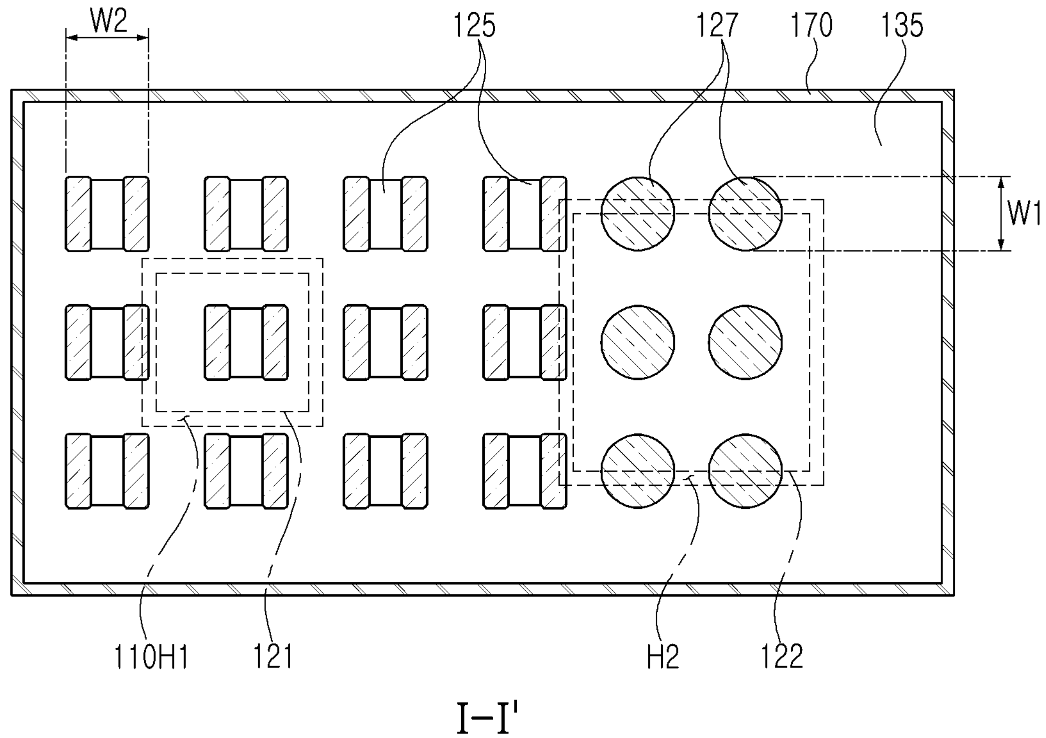

FIG. 1 is a cross-sectional diagram illustrating a semiconductor package 100A according to an example embodiment. FIGS. 2A and 2B are cross-sectional plan diagrams illustrating the semiconductor package illustrated in FIG. 1 along line I-I' in FIG. 1.

Referring to FIGS. 1, 2A and 2B, the semiconductor package 100A may include a frame 110, a first semiconductor chip 121, a second semiconductor chip 122, a heat dissipation member 127, a first encapsulant 131, a backside wiring layer 132, a second encapsulant 135, and an interconnect structure 140. The terms first, second, etc. are used herein to distinguish one element from another. The semiconductor package 100A may further include a passive component 125, a passivation layer 150, an electrical connector metal 160, and an external shielding layer 170.

The frame 110 may include insulating layers 111*a* and 111*b* and wiring structures 112*a*, 112*b*, 112*c*, 113*a*, and 113*b*, and may include a first through-hole 110H1 in which the first semiconductor chip 121 is disposed and a second through-hole 110H2 in which the second semiconductor chip 122 is disposed. The wiring structures 112*a*, 112*b*, 112*c*, 113*a*, and 113*b* may include wiring layers 112*a*, 112*b*, and 112*c* and wiring vias 113*a* and 113*b*. The frame 110 may further include a ground wiring layer 112G physically spaced apart from the wiring layers 112*a*, 112*b*, and 112*c* and in contact with the external shielding layer 170.

The frame 110 may improve stiffness of the semiconductor package 100A depending on a material of the frame 110, and may secure or otherwise provide uniformity of a thickness of the first encapsulant 131. The frame 110 may be disposed on a first surface S1 of the interconnect structure 140, and at least a portion of the frame 110 may be sealed by the first encapsulant 131.

The first through-hole 110H1 and the second through-hole 110H2 may penetrate the frame 110, and the first and second semiconductor chips 121 and 122 may be disposed in the first and second through-holes 110H1 and 110H2, respectively. A wall of each of the first through-hole 110H1 and the second through-hole 110H2 may be spaced apart from the semiconductor chips 121 and 122 by a certain distance. The semiconductor chips 121 and 122 may be surrounded by walls of the through-holes 110H1 and 110H2. However, example embodiments are not limited thereto. In some embodiments, the frame 110 may not be provided. For example, when the frame 110 is not provided, a wiring structure 112P (in FIG. 21), a conductive post, may penetrate the first encapsulant 131 and may be electrically connected to the backside wiring layer 132 and a redistribution layer 142 of the interconnect structure 140.

The insulating layers 111*a* and 111*b* may include an insulating material. As the insulating material, a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, Ajinomoto build-up film (ABF), FR-4, bismaleimide triazine (BT), or the like, may be used, for example.

The wiring layers 112*a*, 112*b*, and 112*c* may redistribute connection pads 121P and 122P of the first and second semiconductor chips 121 and 122, and may provide a pad pattern for the wiring vias 113*a* and 113*b* connecting an upper portion and a lower portion of the frame 110. As a material of the wiring layers 112*a*, 112*b*, and 112*c*, a metal material such as copper (Cu), aluminum (Al), silver (Ag), tin (Sn), gold (Au), nickel (Ni), lead (Pb), titanium (Ti), or alloys thereof may be used. The wiring layers 112*a*, 112*b*, and 112*c* may include a plurality of wiring layers 112*a*, 112*b*, and 112*c* disposed on different levels, and the plurality of wiring vias 113*a* and 113*b* may perform various functions depending on designs of respective layers. For example, the plurality of wiring layers 112*a*, 112*b*, and 112*c* may include a ground (GND) pattern, a power (PWR) pattern, a signal (S) pattern, and the like. The signal (S) pattern may include or may be configured to conduct various signals other than those conducted by a ground (GND) pattern, a power (PWR) pattern, and the like. For example, the signal (S) patterns may be configured to conduct a data signal, and the like.

The wiring vias 113*a* and 113*b* may electrically connect the wiring layers 112*a*, 112*b*, and 112*c* disposed on different levels to each other and may form an electrical path in the frame 110. The wiring vias 113*a* and 113*b* may include a conductive material. For example, each of the wiring vias 113*a* and 113*b* may be configured as a filled via completely filled with a metal material, or may be configured as a conformal via in which a metal material is formed along a wall of a via hole. A side surface of each of the wiring vias 113*a* and 113*b* may have a tapered shape, and a well-known shape, such as an hour-glass shape, a cylindrical shape, and the like, may be applied as a shape of the side surface. The wiring vias 113$a$ and 113$b$ may be integrated (e.g., formed by a same process and/or defining a unitary structure) with the wiring layers 112$a$, 112$b$, and 112$c$, but example embodiments are not limited thereto.

For example, the frame 110 in the example embodiment may include a first insulating layer 111$a$ disposed on the first surface S1 of the interconnect structure 140, a first wiring layer 112$a$ buried in the first insulating layer 111$a$ and having at least one portion in contact with the first surface S1 of the interconnect structure 140, a second wiring layer 112$b$ disposed on a region opposing a region of the first insulating layer 111$a$ in which the first wiring layer 112$a$ is buried, a second insulating layer 111$b$ disposed on a region opposing a region of the first insulating layer 111$a$ in which the first wiring layer 112$a$ is buried and covering at least a portion of the second wiring layer 112$b$, a third wiring layer 112$c$ disposed on a region opposing a region of the second insulating layer 111$b$ in which the second wiring layer 112$b$ is buried, a first wiring via 113$a$ penetrating the first insulating layer 111$a$ and electrically connecting the first and second wiring layers 112$a$ and 112$b$ to each other, and a second wiring via 113$b$ penetrating the second insulating layer 111$b$ and electrically connecting the second and third wiring layers 112$b$ and 112$c$ to each other. A ground wiring layer 112G may be spaced apart from the first to third wiring layers 112$a$, 112$b$, and 112$c$ and may be disposed in an outer region of the frame 110, and may be in contact with the external shielding layer 170 covering a surface of the frame 110.

The first semiconductor chip 121 may have a first active surface A1 on which a first connection pad 121P is disposed and a first inactive surface 11 opposing the first active surface A1, and the first active surface A1 may be configured to oppose or face the first surface S1 of the interconnect structure 140. The first connection pad 121P may be connected to a redistribution pattern 142P of the interconnect structure 140.

The second semiconductor chip 122 may have a second active surface A2 on which a second connection pad 122P is disposed and a second inactive surface 12 opposing the second active surface A2 is disposed, and the second inactive surface 12 may be configured to oppose or face the first surface S1 of the interconnect structure 140. The second inactive surface 12 may be connected to vertical connection conductors 142HP and 143HV of the interconnect structure 140. The vertical connection conductors 142HP and 143HV may include a heat dissipation pattern 142HP and a heat dissipation via 143HV.

For example, in the example embodiment, the first active surface A1 of the first semiconductor chip 121 may be configured to oppose or face the first surface S1 of the interconnect structure 140, and the second inactive surface 12 of the second semiconductor chip 122 is configured to oppose or face the first surface S1 of the interconnect structure 140. Accordingly, the first connection pad 121P disposed on the first active surface A1 of the first semiconductor chip 121 may be connected to the redistribution pattern 142P, and the second inactive surface 12 of the second semiconductor chip 122 may be connected to the vertical connection conductors 142HP and 143HV. As the first connection pad 121P is connected to the redistribution pattern 142P of the interconnect structure 140, a connection path between the first connection pad 121P and passive components 125 may be reduced, and a mounting area of the passive components 125 may be reduced. As the second inactive surface 12 is connected to the vertical connection conductors 142HP and 143HV, heat generated by the second semiconductor chip 122 may be effectively emitted. Thus, the second semiconductor chip 122 may be configured as a logic chip emitting greater amounts of heat. For example, the first semiconductor chip 121 may be configured as a power management integrated circuit (PMIC), and the second semiconductor chip 122 may be configured as a radio-frequency integrated circuit (RFIC).

Each of the first and second semiconductor chips 121 and 122 may be configured as an integrated circuit (IC) in a bare state in which a bump or a wiring layer is not formed. However, example embodiments are not limited thereto, and the first and second semiconductor chips 121 and 122 may be configured as packaged-type integrated circuits in some embodiments. The integrated circuit may be formed based on an active wafer. In this case, as a base material of a body of the semiconductor chip, silicon (Si), germanium (Ge), gallium arsenide (GaAs), or the like, may be used. Various circuits may be formed in the body. The connection pads 121P and 122P are configured to electrically connect the semiconductor chips to the other components, and as a material of the connection pads 121P and 122P, a conductive material such as aluminum (Al), or the like, may be used. The integrated circuit may be implemented by a processor chip such as a central processing unit (CPU), a graphics processor (GPU), a field programmable gate array (FPGA), an application processor (AP), a digital signal processor, a cryptographic processor, a microprocessor, a microcontroller, and the like, but example embodiments are not limited thereto. Alternatively, the integrated circuit may be implemented by a logic chip such as an application-specific IC (ASIC), or the like, a memory chip such as a volatile memory (e.g., a DRAM), a non-volatile memory (e.g., a ROM and a flash memory), or the like, but example embodiments are not limited thereto. Also, the integrated circuit may be implemented by combination of the above-described processors or chips.

The passive component 125 may be disposed on a second surface S2 of the interconnect structure 140, and may be connected to the redistribution pattern 142P. The passive component 125 may also be disposed in a region in which the passive component 125 does not vertically overlap the first semiconductor chip 121. The passive component 125 may be connected to the redistribution pattern 142P through a conductive bump. The passive component 125 may be implemented by a capacitor such as a multilayer ceramic capacitor (MLCC), a low inductance chip capacitor (LICC), an inductor such as a power inductor, a bead, or the like. The number of the passive components 125 is not limited to any particular number, and may be greater or less than the example illustrated in the diagrams. The passive components 125 may have different heights and widths (sizes). Each of the passive components 125 may also have a thickness different from a thickness of each of the semiconductor chips 121 and 122. Differently from the examples illustrated in FIGS. 1, 2A, and 2B, the plurality of passive components 125 may have different widths W2.

The heat dissipation member 127 may be disposed on the second surface S2 of the interconnect structure 140, and may be connected to the vertical connection conductors 142HP and 143HV. The heat dissipation member 127 may be connected to the vertical connection conductors 142HP and 143HV through a conductive bump. The heat dissipation member 127 may be disposed in a region in which the heat dissipation member 127 vertically overlaps the second semiconductor chip 122. The heat dissipation member 127 may dissipate heat generated by the second semiconductor chip 122. The heat dissipation member 127 may include a conductive material such as copper (Cu), aluminum (Al), silver (Ag), tin (Sn), gold (Au), nickel (Ni), lead (Pb), titanium (Ti), or alloys thereof. The heat dissipation members 127 may have different heights and widths (sizes). When a width W1 of the heat dissipation member 127 is similar to a width W2 of the passive component 125, the heat dissipation members 127 may be mounted together in a process of mounting the passive component 125 such that the time for a fixing process may be reduced. However, example embodiments are not limited thereto. Differently from the example illustrated in FIGS. 2A and 2B, the width W1 of the heat dissipation member 127 may be different from the width W2 of the passive component 125.

Also, a height T1 of the heat dissipation member 127 may be greater than heights T2 and T3 of the passive component 125. For example, a height of the heat dissipation member 127 may be 300 to 900 μm. Accordingly, the upper surface of the heat dissipation member 127 may be in contact with the external shielding layer 170, and an upper surface of the passive component 125 may be spaced apart from the external shielding layer 170. The upper surface of the heat dissipation member 127 may be formed to be substantially coplanar with the upper surface of the second encapsulant 135, e.g., by a grinding process. Accordingly, the upper surface of the heat dissipation member 127 may be exposed from an upper surface of the second encapsulant 135.

The first encapsulant 131 may cover the first surface S1 of the interconnect structure 140, and may encapsulate at least a portion of each of the frame 110, the first semiconductor chip 121, and the second semiconductor chip 122. The first encapsulant 131 may fill at least a portion of each of the first through-hole 110H1 and the second through-hole 110H2. The first encapsulant 131 may include an insulating material, such as a thermosetting resin such as an epoxy resin, a thermoplastic resin such as polyimide, or a resin formed by adding an reinforcement such as an inorganic filler to the above-mentioned resins, such as ABF, FR-4, BT, or the like, for example. Also, a molding material such as an EMC or a photosensitive material such as a PIE may be used. In some embodiments, a material in which an insulating resin such as a thermosetting resin or a thermoplastic resin is impregnated in a core material such as an inorganic filler and/or a glass fiber may be used.

The backside wiring layer 132 may be disposed on the first encapsulant 131, and may be connected to the second connection pad 122P. The backside wiring layer 132 may be connected to at least one of the wiring layers 112*a*, 112*b*, 112*c* or the second connection pad 122P through a backside via 133 penetrating the first encapsulant 131. Each of the backside wiring layer 132 and the backside via 133 may include a conductive material such as copper (Cu), aluminum (Al), silver (Ag), tin (Sn), gold (Au), nickel (Ni), lead (Pb), titanium (Ti), or alloys thereof. The backside wiring layer 132 may include a signal pattern, a via pad for a signal, or the like. Also, the backside wiring layer 132 may be connected to a ground pattern and may be used as a ground.

The second encapsulant 135 may cover the second surface S2 of the interconnect structure 140 and may encapsulate at least a portion of each of the passive component 125 and the heat dissipation member 127. The second encapsulant 135 may include an insulating material, such as a thermosetting resin such as an epoxy resin, a thermoplastic resin such as polyimide, or a resin formed by adding a reinforcement such as an inorganic filler to the above-mentioned resins, such as ABF, FR-4, BT, or the like, for example. Also, a molding material such as an EMC or a photosensitive material such as a PIE may be used. In some embodiments, a material in which an insulating resin such as a thermosetting resin or a thermoplastic resin is impregnated in a core material such as an inorganic filler and/or a glass fiber may be used.

The interconnect structure 140 may have the first surface S1 and the second surface S2 opposing the first surface S1, and may include an insulating layer 141, a redistribution layer 142, and a redistribution via layer 143. For example, the interconnect structure 140 may include the frame 110, one or more insulating layers 141 disposed on the first active surface A1 and the second inactive surface 12, one or more redistribution layers 142 disposed on the one or more insulating layers 141, respectively, and one or more redistribution via layer 143 penetrating the one or more insulating layers 141, respectively, and connecting the one or more redistribution layers 142 to at least one of the wiring layer 112*a* of the frame 110, the first connection pad 121P on the first active surface A1, or the second inactive surfaces 12. FIG. 1 illustrates three insulating layers 141, three redistribution layers 142, and three redistribution via layers 143, but example embodiments are not limited thereto. The interconnect structure 140 may include more or fewer of the insulating layers, the redistribution layers, and the redistribution via layers than the example illustrated in the diagram.

As a material of the insulating layer 141, an insulating material may be used. As the insulating material, a photosensitive insulating material PID may be used, and in this case, a fine pitch may be introduced through a photo-via such that several tens to several millions of the connection pads 121P and 122P included in the semiconductor chips 121 and 122 may be redistributed effectively.

The redistribution layer 142 may redistribute the first connection pads 121P of the first semiconductor chip 121 and may electrically connect the first connection pads 121P to the passive component 125. The redistribution layer 142 may include a conductive material such as copper (Cu), aluminum (Al), silver (Ag), tin (Sn), gold (Au), nickel (Ni), lead (Pb), titanium (Ti), or alloys thereof. The redistribution layer 142 may also perform various functions depending on a design. For example, the redistribution layer 142 may include a ground (GND) pattern, a power (PWR) pattern, a signal (S) pattern, and the like.

The redistribution via layer 143 may electrically connect the redistribution layers 142 disposed on different levels, and may electrically connect the first connection pad 121P of the first semiconductor chip 121 to the redistribution layer 142. The redistribution via layer 143 may be physically in contact with a first connection pad 121P when the first semiconductor chip 121 is configured as a bare die. The redistribution via layer 143 may include a conductive material such as copper (Cu), aluminum (Al), silver (Ag), tin (Sn), gold (Au), nickel (Ni), lead (Pb), titanium (Ti), or alloys thereof. A via of the redistribution via layer 143 may be configured as a filled via completely filled with a metal material, or may be configured as a conformal via in which a metal material is formed along a wall of a via hole. A side surface of the redistribution via layer 143 may have a tapered shape, and various well-known shapes such as an hour-glass shape, a cylindrical shape, and the like, may be used. The redistribution via layer 143 may be integrated with the redistribution layer 142, but example embodiments are not limited thereto.

The redistribution layer 142 may include the redistribution pattern 142P and the heat dissipation pattern 142HP, and the redistribution via layer 143 may include a redistribution via 143V and a heat dissipation via 143HV (in example embodiments, the heat dissipation pattern 142HP and the heat dissipation via 143HV may be referred to as vertical connection conductors). The redistribution pattern 142P and the heat dissipation pattern 142HP may be physically spaced apart from each other, e.g., in a lateral direction that is different than the vertical direction of extension of the vias 143HV, 143HV. The redistribution pattern 142P may connect the passive component 125 to the first connection pad 121P, and the heat dissipation pattern 142HP may connect the heat dissipation member 127 to the second inactive surface 12. The heat dissipation via 143HV may be disposed between the heat dissipation pattern 142HP and the second inactive surface 12, and may connect the heat dissipation pattern 142HP to the second inactive surface 12.

The heat dissipation pattern 142HP and the heat dissipation via 143HV may include a plurality of heat dissipation patterns 142HP and a plurality of heat dissipation vias 143HV disposed on different levels. An uppermost dissipation pattern 142HP of the plurality of heat dissipation patterns 142HP directly connected to the heat dissipation member 127 may protrude from the second surface S2 of the interconnect structure 140. Accordingly, the heat dissipation member 127 may be more easily mounted. A lowermost heat dissipation pattern 143HV of the plurality of heat dissipation vias 143HV may be directly connected to the second inactive surface 12 and may transfer heat generated by the second semiconductor chip 122 to the heat dissipation member 127. As used herein, when an element is "directly" on, connected, or contacting another element, no intervening elements are present.

The heat dissipation pattern 142HP and the heat dissipation via 143HV may include the plurality of heat dissipation patterns 142HP disposed on the same level and spaced apart from each other and the plurality of heat dissipation vias 143HV connected to the plurality of heat dissipation patterns 142HP. The plurality of heat dissipation vias 143HV may be integrated with corresponding heat dissipation patterns 142HP of the plurality of heat dissipation patterns 142HP. The plurality of heat dissipation vias 143HV may increase a contact area with the second inactive surface 12 such that heat dissipation efficiency may improve.

The redistribution pattern 142P and the redistribution via 143V may include a plurality of redistribution patterns 142P disposed on different levels and a plurality of redistribution via 143V. Similarly to the plurality of heat dissipation patterns 142HP, an uppermost redistribution pattern 142P of the plurality of redistribution patterns 142P may protrude from the second surface S2 of the interconnect structure 140. Accordingly, the passive component 125 may be more easily mounted, and a space filled with the second encapsulant 135 between the passive component 125 and the second surface S2 may be sufficiently secured.

The passivation layer 150 may be disposed on the first encapsulant 131, and may have an opening h (in FIG. 9) for exposing at least a portion of the backside wiring layer 132. The passivation layer 150 may protect the backside wiring layer 132 from external physical and/or chemical damage. The passivation layer 150 may include an insulating resin and an inorganic filler. For example, the passivation layer 150 may be configured as an ABF, but example embodiments are not limited thereto. The passivation layer 150 may be configured as an PIE or a solder resist.

Figure 9:
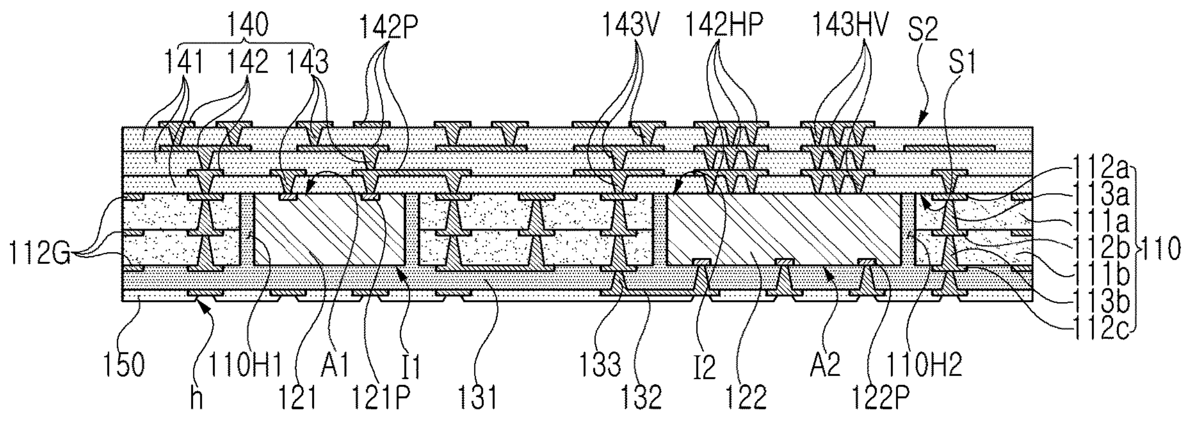

The electrical connector metal 160 may be disposed on the passivation layer 150 and may be connected to the backside wiring layer 132 exposed by the opening h (in FIG. 9). The electrical connector metal 160 may physically and/or electrically connect the semiconductor package 100A to an external entity. For example, the semiconductor package 100A may be mounted on a substrate of an electronic device through the electrical connector metal 160. The electrical connector metal 160 may be formed of a low-melting-point metal, such as tin (Sn) or an alloy including tin (Sn), for example. As an example, the electrical connector metal 160 may be formed of a solder, but example embodiments are not limited thereto. The electrical connector metal 160 may be configured as a land, a ball, a pin, and the like. The electrical connector metal 160 may include multiple layers or a single layer. When the electrical connector metal 160 includes multiple layers, the electrical connector metal 160 may include a copper pillar and a solder. When the electrical connector metal 160 includes a single layer, the electrical connector metal 160 may include a tin-silver solder or copper, but example embodiments are not limited thereto. The number of electrical connector metals 160, a gap between the electrical connector metals 160, and a dispositional form of the electrical connector metal 160 may not be limited to any particular examples, and may be varied in example embodiments. For example, the number of the electrical connector metals 160 may be several tens to several thousands in accordance with the number of the connection pads of the semiconductor chip, or may be more or fewer than described in the aforementioned examples.

As least one of the electrical connector metals 160 may be disposed in a fan-out region. The fan-out region may refer to a region which does not overlap a region in which the first semiconductor chip 121 or the second semiconductor chip 122 is disposed. A fan-out package may have improved reliability as compared to a fan-in package, may implement a plurality of I/O terminals, and a 3D interconnection may be more easily performed in a fan-out package. Also, a thickness of a fan-out package may be reduced as compared to a ball grid array (BGA) package, a land grid array (LGA), and the like, and may be cost-competitive.

Although not illustrated in the diagrams, an under-bump metallization layer may be disposed between the electrical connector metal 160 and the backside wiring layer 132. The under-bump metallization layer may improve connection reliability of the electrical connector metal 160 and board-level reliability of the package 100A. The under-bump metallization layer may be connected to the wiring layer 112*c* of the frame 110. The under-bump metallization layer may be formed by a metallization method using a metal, but example embodiments are not limited thereto.

The external shielding layer 170 may cover at least a portion of an exterior surface of each of the second encapsulant 135, the interconnect structure 140, and the first encapsulant 131. The external shielding layer 170 may be connected to the ground wiring layer 112G of the frame 110 and may receive a ground signal, but example embodiments are not limited thereto. For example, the external shielding layer 170 may be connected to the redistribution layer 142 in a region not illustrated in the diagram. The external shielding layer 170 may include a metal material, and the metal material may be copper (Cu), aluminum (Al), silver (Ag), tin (Sn), gold (Au), nickel (Ni), lead (Pb), titanium (Ti), or alloys thereof. The external shielding layer 170 may improve an EMI shielding function. Also, at least a portion of the external shielding layer 170 may be directly in contact with an upper surface of the heat dissipation member 127. Accordingly, heat generated by the second semiconductor chip 122 may be externally emitted from the semiconductor package 100A through the external shielding layer 170. The external shielding layer 170 may include a plurality of layers. For example, the external shielding layer 170 may be configured as a dual layer including an SUS and copper, or may be configured to include three layers including an SUS, copper, and an SUS stacked in order from an exterior surface of the second encapsulant 135, and the like.

FIGS. 3 to 14 are cross-sectional diagrams illustrating methods of manufacturing the semiconductor package 100A illustrated in FIG. 1.

Figure 3:
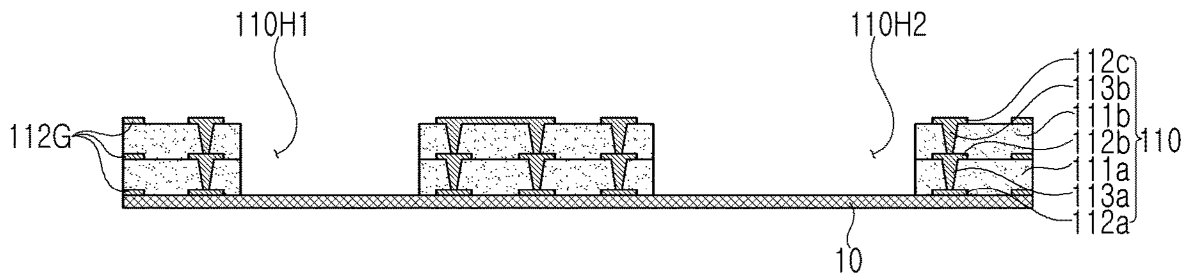
FIGS. 3, 4, 5, 6, 7, 8, 9, 10, 11, 12, 13, and 14 are cross-sectional diagrams illustrating a method of manufacturing the semiconductor package illustrated in FIG. 1.

Referring to FIG. 3, a frame 110 including a first through-hole 110H1 and a second through-hole 110H2 may be attached to an adhesive film 10 (e.g., a general tape). The frame 110 may be manufactured by forming a first insulating layer 111*a* by a method of forming a first wiring layer 112*a* through a generally used plating process such as an SAP or an MSAP using a copper clad laminate (CCL), laminating a precursor on the first wiring layer 112*a* through a generally used lamination method, and performing a curing process, or by a method of coating a precursor material using a generally used coating method and performing a curing process, forming a first wiring via hole using a photolithography method, a mechanical drill and/or a laser drill, and forming a first wiring via 113*a* and a second wiring layer 112*b*, e.g., using the above-mentioned plating process. The first through-hole 110H1 and the second through-hole 110H2 may be formed using a mechanical drill and/or a laser drill. However, example embodiments are not limited thereto, and the first through-hole 110H1 and the second through-hole 110H2 may be also be formed by a sand-blast method, a dry-etching method using a plasma, or the like. A plurality of ground wiring layers 112G physically spaced apart from the wiring layers 112*a*, 112*b*, and 112*c* may be formed on a periphery of the frame 110, e.g., using the above-mentioned plating process. The adhesive film 10 may be implemented by a heat treatment curable adhesive tape, adhesive force of which may be weakened by heat treatment, or an infrared curable adhesive tape, adhesive force of which is weakened by irradiating an infrared ray.

Figure 4:
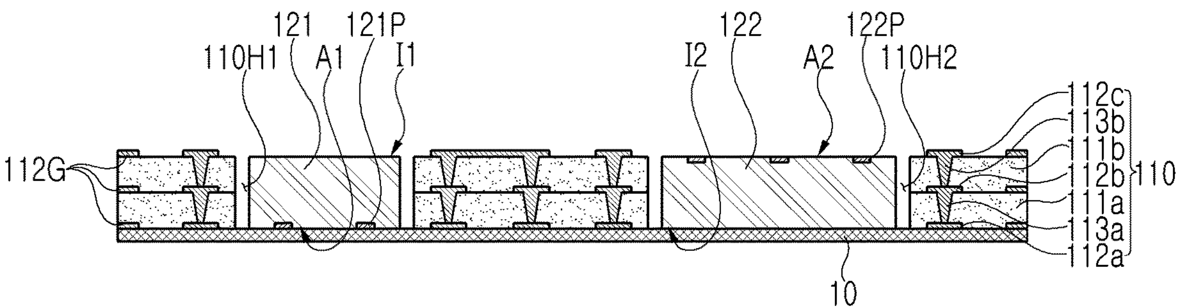

Referring to FIG. 4, a first semiconductor chip 121 may be disposed in the first through-hole 110H1, and a second semiconductor chip 122 may be disposed in the second through-hole 110H2. The first semiconductor chip 121 may be oriented for attachment of a first active surface A1 (on which a first connection pad 121P is disposed) to the adhesive film 10, and the second semiconductor chip 122 may be oriented for attachment of a second inactive surface 12 (opposing a second active surface A2 on which a second connection pad 122P is disposed) to the adhesive film 10. The first semiconductor chip 121 may be disposed on the adhesive film 10 and may be oriented face down, and the second semiconductor chip 122 may be disposed on the adhesive film 10 and may be oriented face up.

Figure 5:
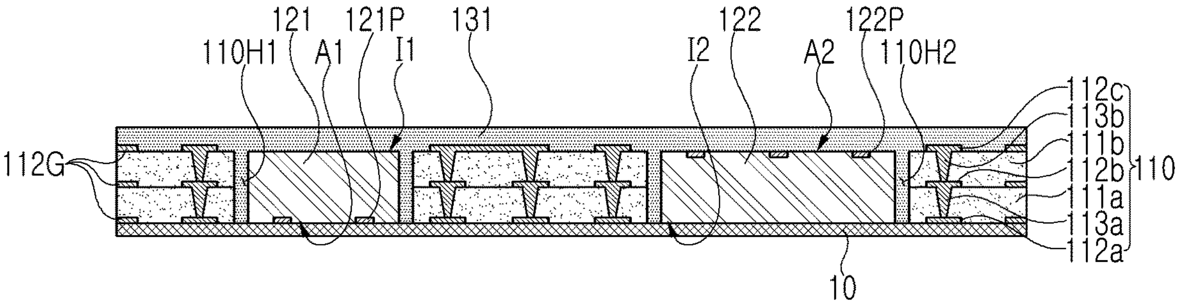

Referring to FIG. 5, a first encapsulant 131 covering at least a portion of each of the frame 110, the first semiconductor chip 121, and the second semiconductor chip 122 may be disposed on the adhesive film 10. The first encapsulant 131 may fill spaces in the first through-hole 110H1 and the second through-hole 110H2. The first encapsulant 131 may be formed by a generally used method. For example, the first encapsulant 131 may be formed by laminating a precursor and performing a curing process, or by coating the adhesive film 10 with the first encapsulant 131 and performing a curing process. In the lamination process, a method of performing a hot press process in which a precursor is pressured at a relatively high temperature for a certain period of time, is depressurized, and is cooled to room temperature, performing a cold press process for cooling the precursor, and separating a working tool may be used. In the coating process, a screen-printing method of applying an ink using a squeeze, or a spray printing method of mystifying and applying an ink may be used.

Figure 6:
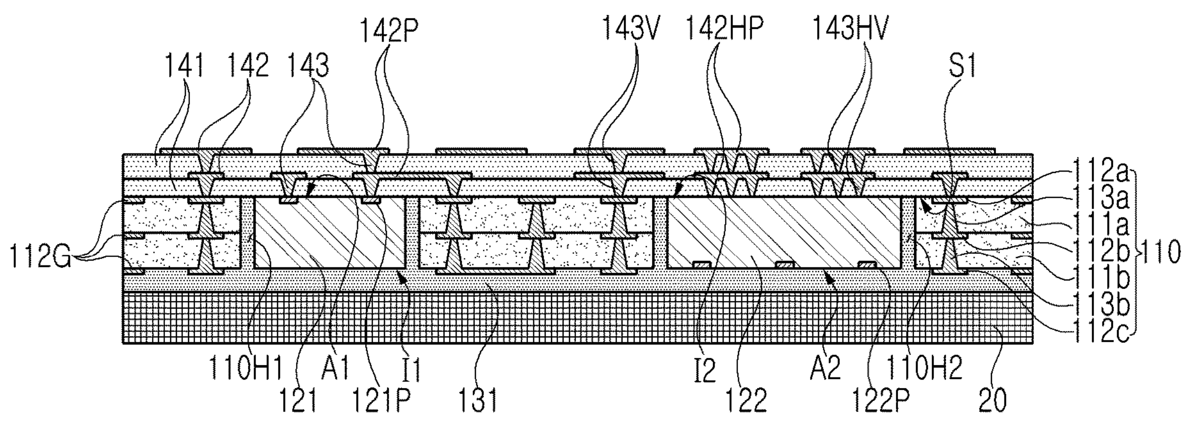

Referring to FIG. 6, an insulating layer 141, a redistribution layer 142, and a redistribution via layer 143 may be formed in order on the frame 110, the first active surface A1, and the second inactive surface 12. The redistribution layer 142 may include a redistribution pattern 142P connected to the first connection pad 121P, and a heat dissipation pattern 142HP connected to the second inactive surface 12, and the redistribution via layer 143 may include a redistribution via 143V connected to the redistribution pattern 142P and a heat dissipation via 143HV connected to the heat dissipation pattern 142HP. The insulating layer 141, and others, may be formed by separating the adhesive film 10 illustrated in FIG. 5, attaching the first encapsulant 131 on a carrier film 20, and disposing the package upside down (as compared to FIG. 5, the package is disposed upside down). The insulating layer 141 may be formed by a lamination method, for example. The redistribution layer 142 and the redistribution via layer 143 may be formed by a generally used plating process. A generally used seed layer, a Ti/Cu layer, for example, may be disposed below the redistribution layer 142 and the redistribution via layer 143.

Figure 7:
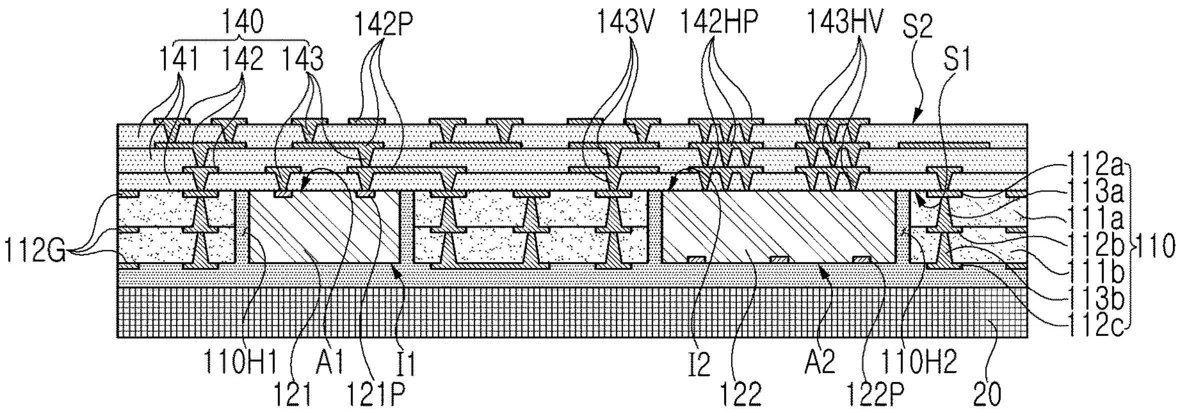

Referring to FIG. 7, an uppermost insulating layer 141 and an uppermost redistribution layer 142 may be formed on an interconnect structure 140. The uppermost insulating layer 141 may include a material different from a material of the insulating layers 141 disposed on a level lower than the uppermost insulating layer 141. For example, the uppermost insulating layer 141 may be configured as an ABF, and the insulating layers 141 disposed on a lower level may be configured as PIEs. The uppermost redistribution layer 142 may include an uppermost redistribution pattern 142P and an uppermost heat dissipation pattern 142HP. The uppermost redistribution pattern 142P and an uppermost heat dissipation pattern 142HP may protrude from the second surface S2 of the interconnect structure 140 and may be formed by a generally used plating process.

Figure 8:
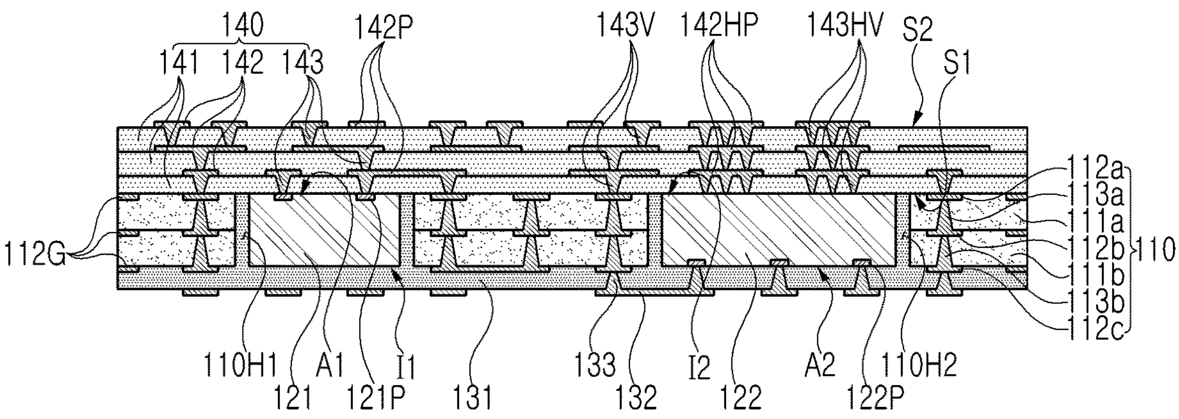

Referring to FIG. 8, the carrier film 20 illustrated in FIG. 7 may be removed, and a backside via 133 penetrating a backside wiring layer 132 and the first encapsulant 131 may be formed on the first encapsulant 131. The first encapsulant 131 may be formed using a generally used plating process. The backside via 133 may be formed in a backside via hole formed using a laser drill, for example, through a plating process.

Referring to FIG. 9, a passivation layer 150 may be formed on the first encapsulant 131 and the backside wiring layer 132. The passivation layer 150 may be formed by laminating a precursor and performing a curing process, or by a method of applying a material for forming the passivation layer 150 and performing a curing process. An opening h for exposing a portion of the backside wiring layer 132 may be formed on the passivation layer 150. The opening h may be formed using a laser drill, for example. The material for forming the passivation layer 150 may be implemented by an ABF.

Figure 10:
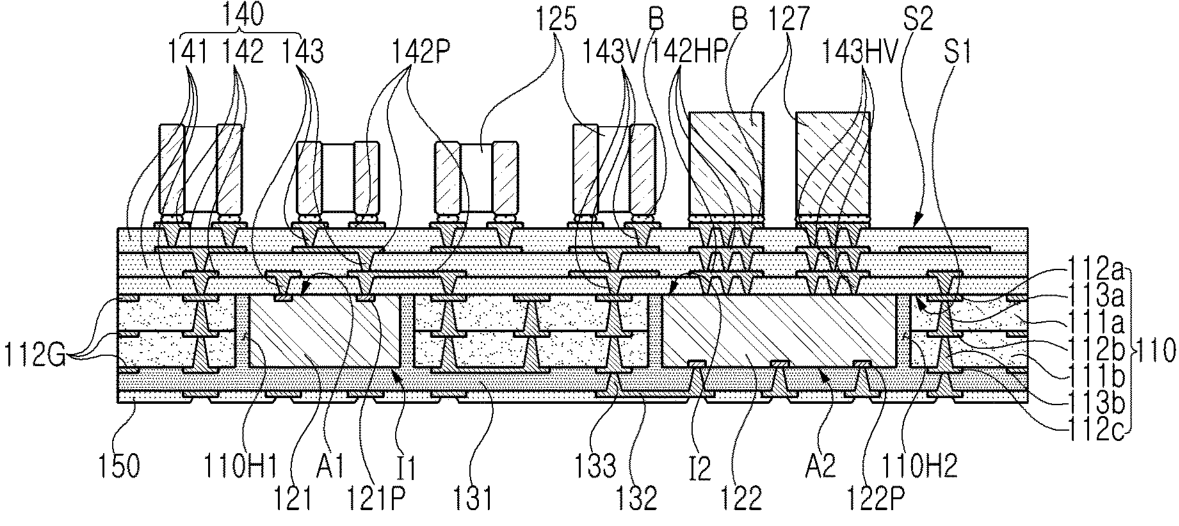

Referring to FIG. 10, a passive component 125 may be mounted on the redistribution pattern 142P, and a heat dissipation member 127 may be mounted on the heat dissipation pattern 142HP. The passive component 125 and the heat dissipation member 127 may be SMT-mounted through a conductive bump B. The conductive bump B may include a conductive material, such as copper (Cu) and solder, for example, but examples of the conductive material are not limited thereto. For example, the conductive bump B may be configured as a land, a ball, or a pin. A width of the heat dissipation member 127 may be similar to a width of the passive component 125, and the passive component 125 and the heat dissipation member 127 may be mounted through the same process.

Figure 11:
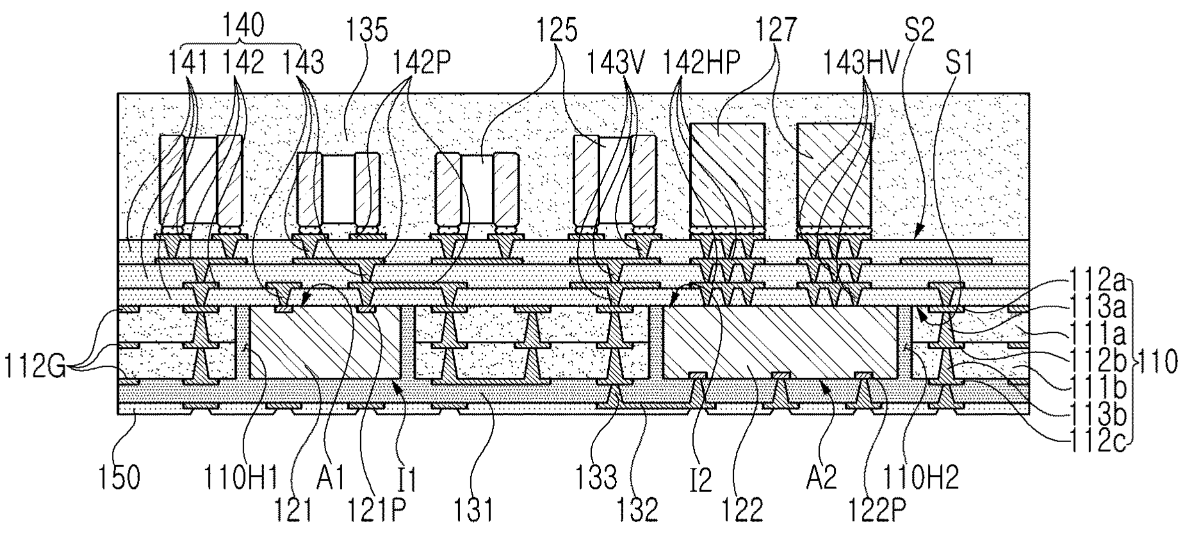

Referring to FIG. 11, a second encapsulant 135 for sealing the passive component 125 and the heat dissipation member 127 may be formed on the second surface S2 of the interconnect structure 140. The second encapsulant 135 may be formed by the same method for forming the first encapsulant 131 described above. The second encapsulant 135 may include a material the same as a material of the first encapsulant 131, but example embodiments are not limited thereto. The first encapsulant 131 and the second encapsulant 135 may include different materials.

Figure 12:
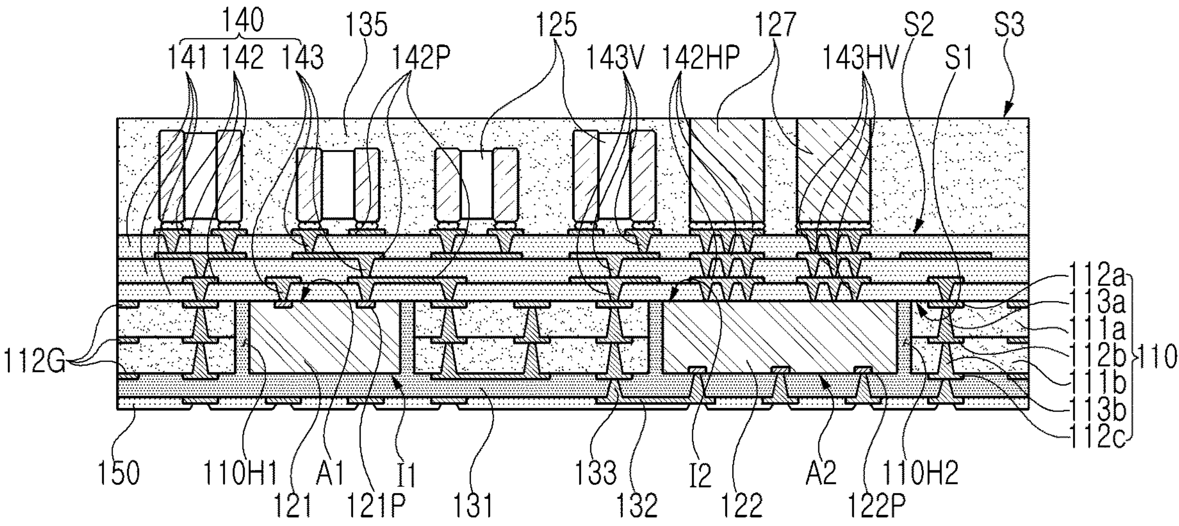

Referring to FIG. 12, an upper portion of the second encapsulant 135 may be planarized using a grinding process. An upper surface of the second encapsulant 135 may be configured to be coplanar with an upper surface of the heat dissipation member 127. The grinding process may include a mechanical and/or chemical grinding process. By the grinding process, the upper surface of the heat dissipation member 127 may be configured to protrude from the upper surface of the second encapsulant 135.

Figure 13:
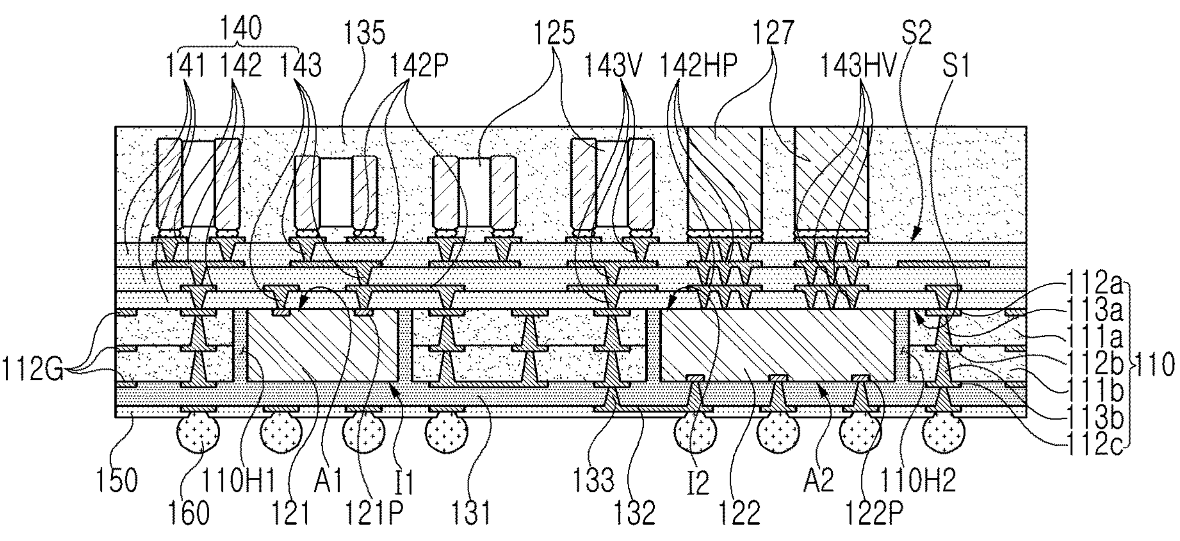

Referring to FIG. 13, an electrical connector metal 160 may be formed in an opening of the passivation layer 150. The electrical connector metal 160 may include a conductive material, and may be formed by a generally used method. The electrical connector metal 160 may be fixed by a reflow. When an under-bump metal layer is not provided as illustrated in the diagram, a portion of the electrical connector metal 160 may be buried in the passivation layer 150 to enhance fixing force, and the other portion may be configured to be externally exposed.

Figure 14:
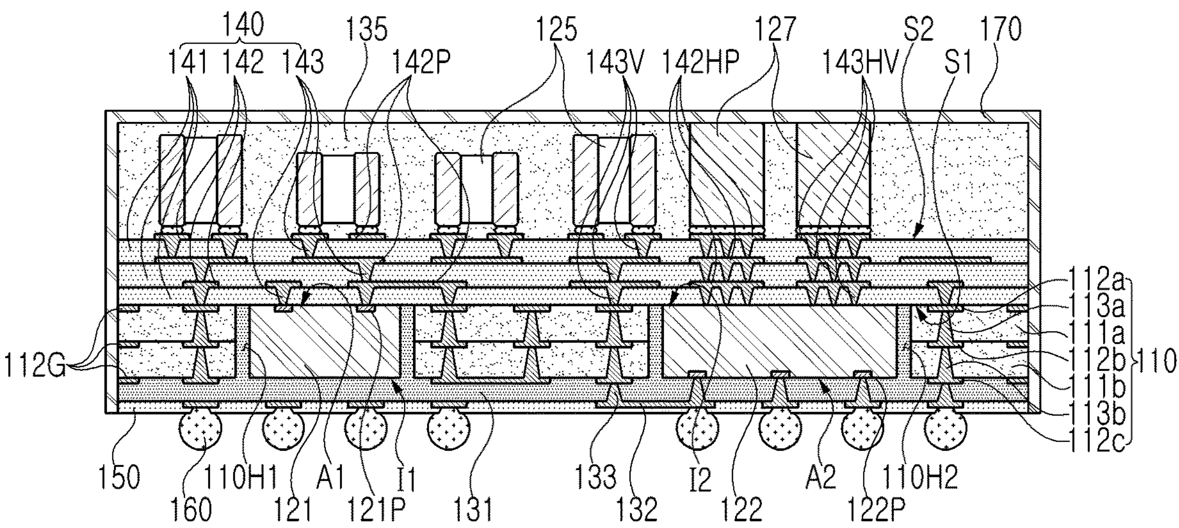

Referring to FIG. 14, an external shielding layer 170 sealing the upper surface and a side surface of the second encapsulant 135, a side surface of the interconnect structure 140, a side surface of the frame 110, a side surface of the first encapsulant 131, and a side surface of the passivation layer 150 may be formed. The external shielding layer 170 may be formed by a sputtering process, for example.

Figure 15:
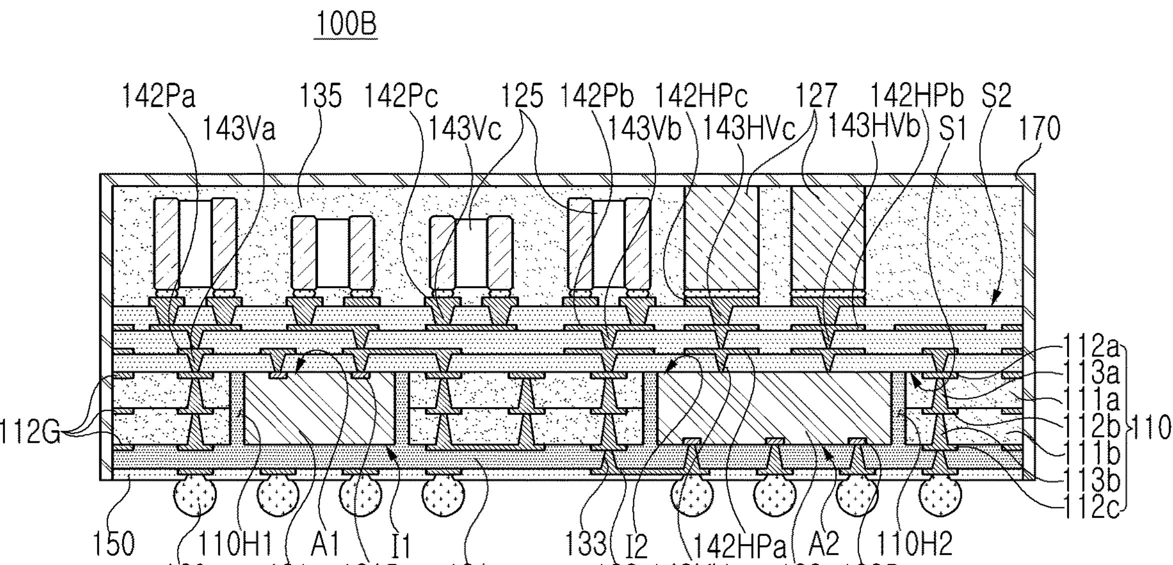
FIG. 15 is a cross-sectional diagram illustrating a semiconductor package according to an example embodiment of the present inventive concept.

FIG. 15 is a cross-sectional diagram illustrating a semiconductor package 100B according to an example embodiment.

Referring to FIG. 15, the semiconductor package 100B may include a plurality of heat dissipation patterns 142HPa, 142HPb, and 142HPc disposed on different levels and a plurality of heat dissipation vias 143HVa, 143HVb, and 143HVc. The semiconductor package 100B may further include a plurality of redistribution patterns 142Pa, 142Pb, 142Pc disposed on different levels, and a plurality of redistribution vias 143Va, 143Vb, and 143Vc.

A thickness of an uppermost heat dissipation pattern 142HPc of the plurality of heat dissipation patterns 142HPa, 142HPb, and 142HPc directly connected to a heat dissipation member 127 may be greater than a thickness of each of the other heat dissipation patterns 142HPb and 142HPa disposed on a level lower than the uppermost heat dissipation pattern 142HPc.

A width of an uppermost heat dissipation via 143HVc of the plurality of heat dissipation vias 143HVa, 143HVb, and 143HVc connected to the uppermost heat dissipation pattern 142HPc may be greater than a width of each of the other heat dissipation vias 143HVb and 143HVa disposed on a level lower than the uppermost heat dissipation via 143HVc. A width of each of the plurality of heat dissipation vias 143HVa, 143HVb, and 143HVc may be configured as a maximum distance or an average distance among the plurality of heat dissipation vias 143HVa, 143HVb, and 143HVc.

The plurality of heat dissipation vias 143HVa, 143HVb, and 143HVc may correspond to the plurality of heat dissipation patterns 142HPa, 142HPb, and 142HPc, respectively. The plurality of heat dissipation vias 143HVa, 143HVb, and 143HVc may be integrated with corresponding heat dissipation patterns 142HPa, 142HPb, and 142HPc, respectively. By increasing a thickness and a width of each of the uppermost heat dissipation pattern 142HPc and the uppermost heat dissipation via 143HVc, heat dissipation efficiency may improve.

The elements in FIG. 15 and in FIG. 1 having the same reference numerals are similar elements, and thus, the detailed descriptions thereof will not be provided.

Figure 16:
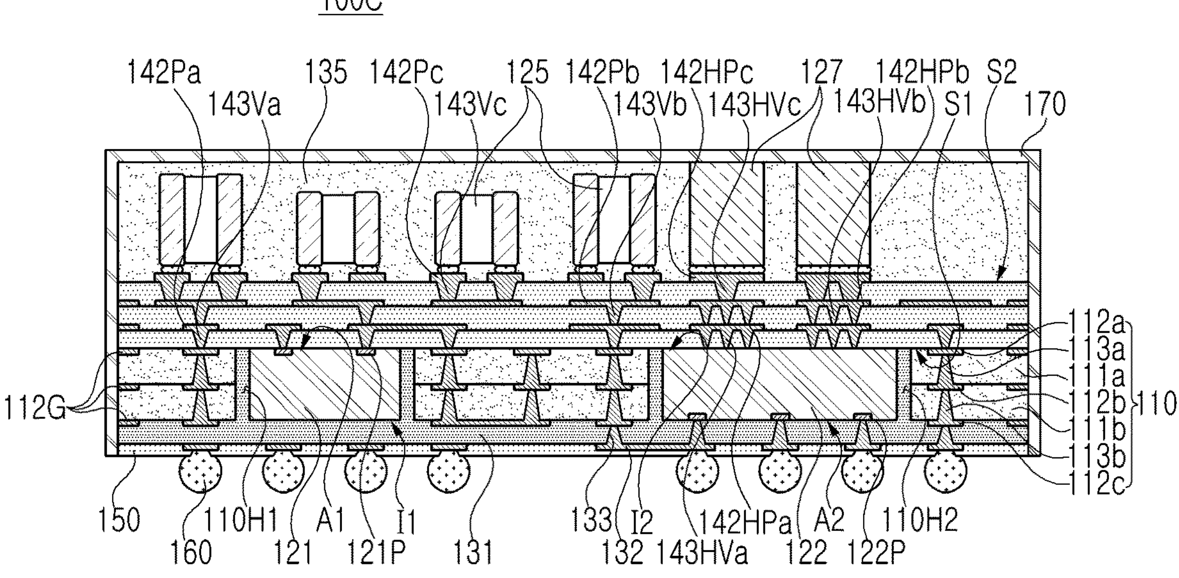
FIG. 16 is a cross-sectional diagram illustrating a semiconductor package according to an example embodiment of the present inventive concept.

FIG. 16 is a cross-sectional diagram illustrating a semiconductor package 100C according to an example embodiment.

Referring to FIG. 16, the semiconductor package 100C in the example embodiment may include a plurality of heat dissipation patterns 142HPa, 142HPb, and 142HPc disposed on different levels and a plurality of heat dissipation vias 143HVa, 143HVb, and 143HVc. The semiconductor package 100C may further include a plurality of redistribution patterns 142Pa, 142Pb, 142Pc disposed on different levels and a plurality of redistribution vias 143Va, 143Vb, and 143Vc.

A thickness of an uppermost heat dissipation pattern 142HPc of the plurality of heat dissipation patterns 142HPa, 142HPb, and 142HPc may be greater than a thickness of each of the other heat dissipation patterns 142HPb and 142HPa. A width of an uppermost heat dissipation via 143HVc of the plurality of heat dissipation vias 143HVa, 143HVb, and 143HVc may be greater than a width of each of the other heat dissipation vias 143HVb and 143HVa disposed on a lower level. A width of each of the plurality of heat dissipation vias 143HVa, 143HVb, and 143HVc may be configured as a maximum distance or an average distance among the plurality of heat dissipation vias 143HVa, 143HVb, and 143HVc.

Accordingly, the number of uppermost heat dissipation vias 143HVc integrated with a single uppermost heat dissipation pattern 142HPc may be smaller than the number of heat dissipation vias 143HVb or heat dissipation vias 143HVa integrated with the heat dissipation pattern 142HPb or the heat dissipation pattern 142HPa disposed on a level lower than the single uppermost heat dissipation pattern 142HPc. For example, when the number of uppermost heat dissipation vias 143HVc is one or two, the number of heat dissipation patterns 142HPb or 142HPa disposed on a lower level may be three or greater.

The elements in FIG. 16 and in FIGS. 1 and 15 having the same reference numerals are similar elements, and thus, the detailed descriptions thereof will not be provided.

Figure 17:
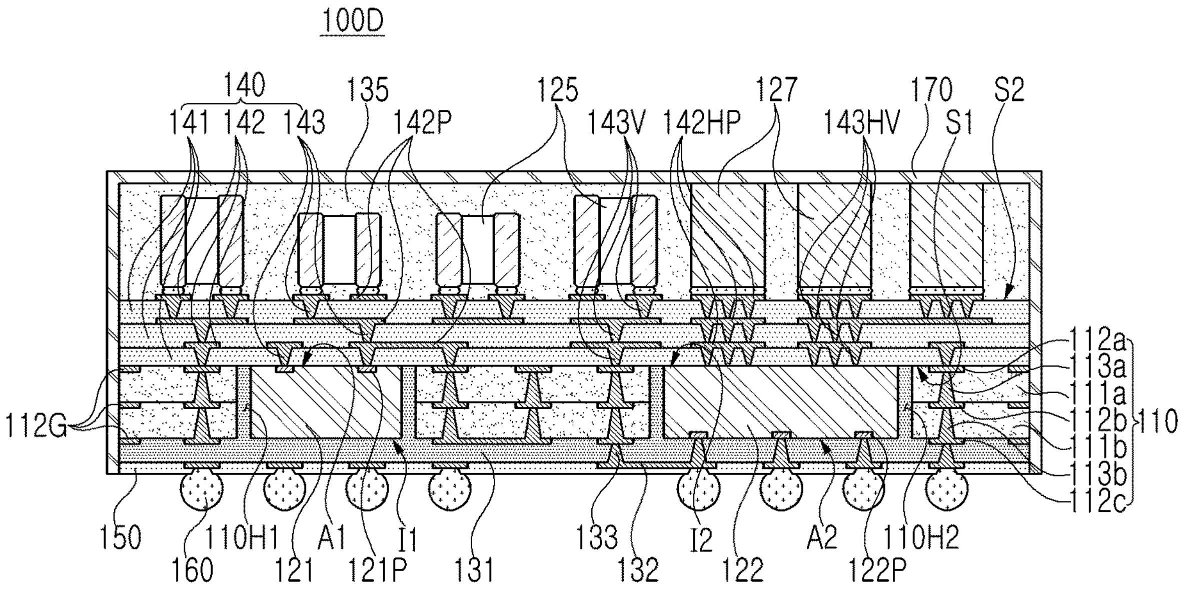
FIG. 17 is a cross-sectional diagram illustrating a semiconductor package according to an example embodiment of the present inventive concept.

FIG. 17 is a cross-sectional diagram illustrating a semiconductor package 100D according to an example embodiment.

Referring to FIG. 17, the semiconductor package 100D in the example embodiment may include a plurality of heat dissipation patterns 142HP disposed on the same level, and may include a plurality of heat dissipation members 127 corresponding to the plurality of heat dissipation patterns 142HP, respectively. At least a portion or subset of the plurality of heat dissipation members 127 may be disposed in a region in which the plurality of heat dissipation members 127 do not vertically overlap a second semiconductor chip 122. The heat dissipation pattern 142HP and the heat dissipation member 127 may be disposed in a region of a second surface S2 of the interconnect structure 140 in which a passive component 125 is not disposed, thereby additionally securing a heat dissipation path.

The elements in FIG. 17 and in FIG. 1 having the same reference numerals are similar elements, and thus, the detailed descriptions thereof will not be provided.

Figure 18:
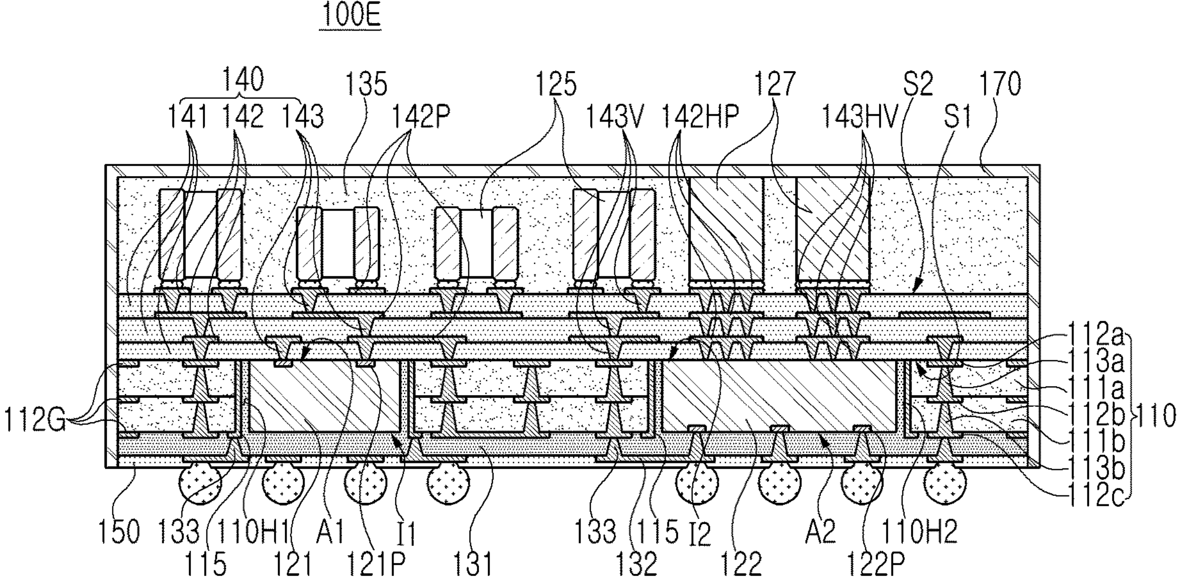
FIG. 18 is a cross-sectional diagram illustrating a semiconductor package according to an example embodiment of the present inventive concept.

FIG. 18 is a cross-sectional diagram illustrating a semiconductor package 100E according to an example embodiment.

Referring to FIG. 18, the semiconductor package 100E in the example embodiment may further include an internal shielding layer 115 disposed on a side wall of at least a portion of a first through-hole 110H1 and a second through-hole 110H2.

The internal shielding layer 115 may be configured to surround semiconductor chips 121 and 122. The internal shielding layer 115 may improve an EMI shielding effect and a heat dissipation effect of the semiconductor chips 121 and 122. The internal shielding layer 115 may include a conductive material such as copper (Cu), aluminum (Al), silver (Ag), tin (Sn), gold (Au), nickel (Ni), lead (Pb), titanium (Ti), or alloys thereof. The internal shielding layer 115 may be formed by a plating process, and may include a seed layer and a conductor layer. The internal shielding layer 115 may be used as a ground, and in this case, the internal shielding layer 115 may be electrically connected to a ground pattern or ground plane included or defined in a backside wiring layer 132 by a backside via 133.

The elements in FIG. 18 and in FIG. 1 having the same reference numerals are similar elements, and thus, the detailed descriptions thereof will not be provided.

Figure 19:
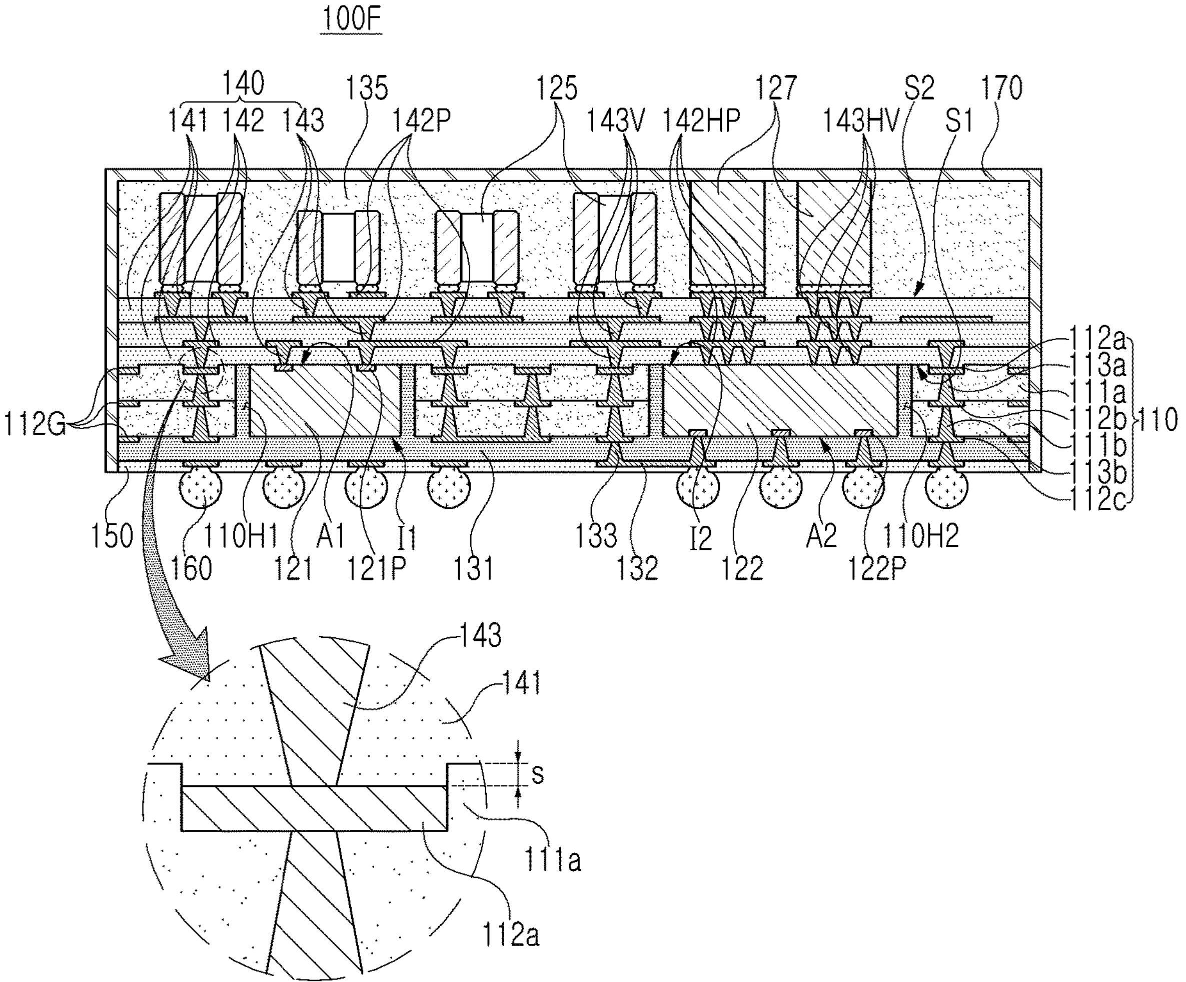
FIG. 19 is a cross-sectional diagram illustrating a semiconductor package according to an example embodiment of the present inventive concept.

FIG. 19 is a cross-sectional diagram illustrating a semiconductor package 100F according to an example embodiment.

Referring to FIG. 19, in the semiconductor package 100F in the example embodiment, a first wiring layer 112*a* may be recessed into a first insulating layer 111*a*, and an upper surface of the first insulating layer 111*a* and an upper surface of the first wiring layer 112*a* may have a step portion s therebetween. Accordingly, a material of a first encapsulant 131 may be reduced or prevented from bleeding to the upper surface of the first wiring layer 112*a* when the first encapsulant 131 is formed. Also, the first wiring layer 112*a* may be recessed into the first insulating layer 111*a* such that the upper surface of the first wiring layer 112*a* may be disposed on a level lower than upper surfaces of connection pads 121P and 122P of semiconductor chips 121 and 122. Further, a distance between a lowermost redistribution pattern 142P and the first wiring layer 112*a* may be greater than a distance between the lowermost redistribution pattern 142P and the connection pads 121P and 122P of the semiconductor chips 121 and 122.

The elements in FIG. 19 and in FIG. 1 having the same reference numerals are similar elements, and thus, the detailed descriptions thereof will not be provided.

Figure 20:
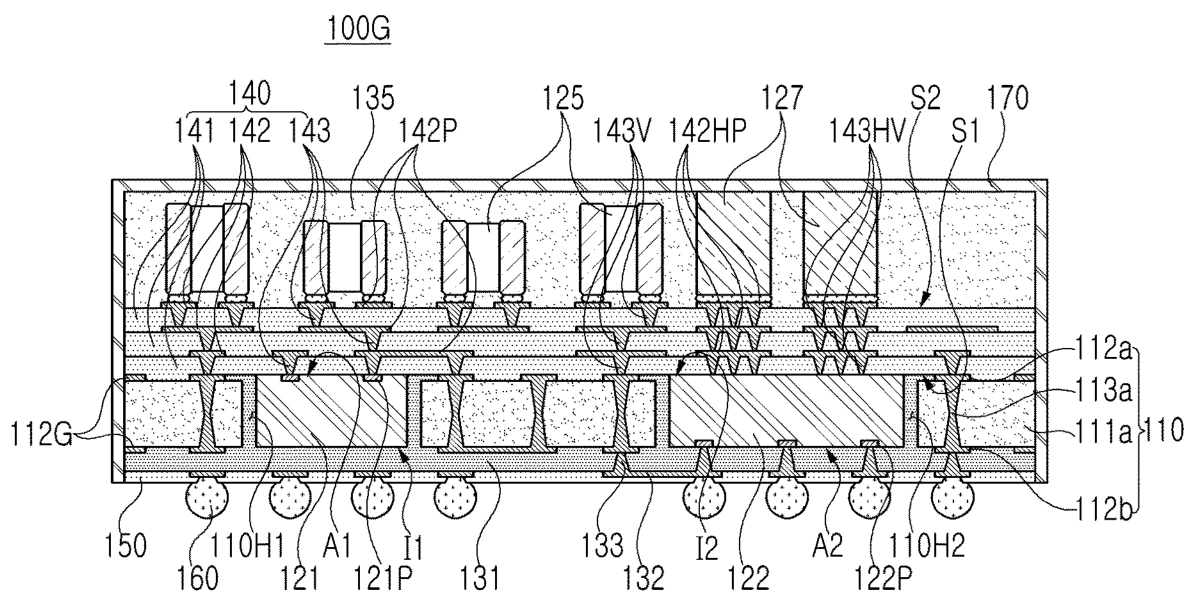
FIG. 20 is a cross-sectional diagram illustrating a semiconductor package according to an example embodiment of the present inventive concept.

FIG. 20 is a cross-sectional diagram illustrating a semiconductor package 100G according to an example embodiment.

Referring to FIG. 20, in the semiconductor package 100G in the example embodiment, a frame 110 may include an insulating layer 111*a*, a first wiring layer 112*a* disposed on an upper surface of the insulating layer 111*a*, a second wiring layer 112*b* disposed on a lower surface of the insulating layer 111*a* opposing a surface on which the first wiring layer 112*a* is disposed, and a first wiring via 113*a* electrically connecting the first wiring layer 112*a* to the second wiring layer 112*b*. In some embodiments, a second insulating layer or a third insulating layer may be further disposed on the first and second wiring layers 112*a* and 112*b*. A redistribution layer 142 of an interconnect structure 140 may be configured as a fine pitch through a semiconductor process to reduce a thickness of the redistribution layer 142, and each of the first and second wiring layers 112*a* and 112*b* of the frame 110 may have a relatively great or larger size through a substrate process.

The elements in FIG. 20 and in FIG. 1 having the same reference numerals are similar elements, and thus, the detailed descriptions thereof will not be provided.

Figure 21:
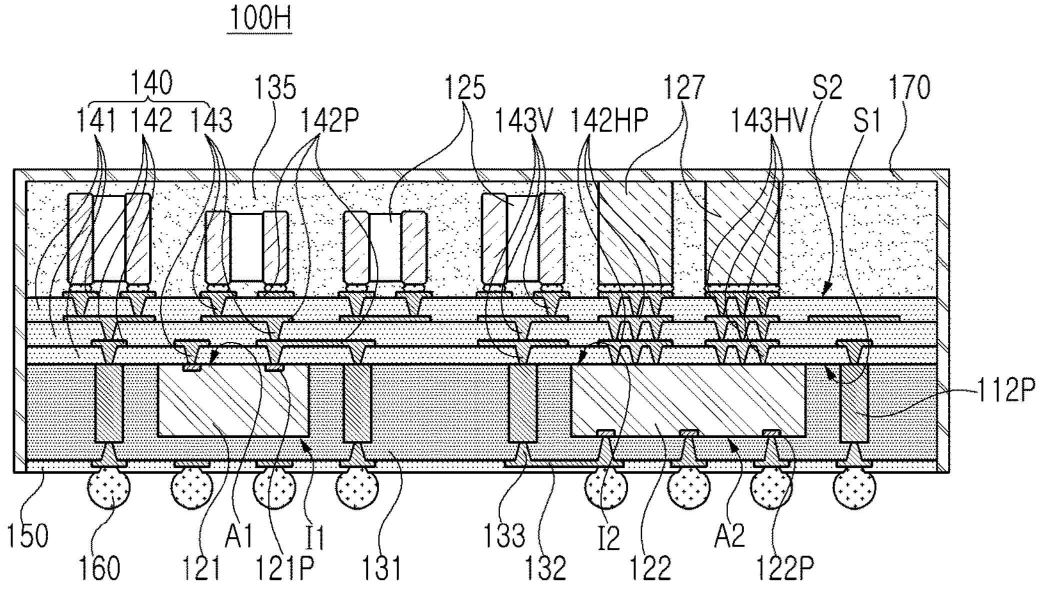
FIG. 21 is a cross-sectional diagram illustrating a semiconductor package according to an example embodiment of the present inventive concept.

FIG. 21 is a cross-sectional diagram illustrating a semiconductor package 100H according to an example embodiment.

Referring to FIG. 21, in the semiconductor package 100H in the example embodiment, a wiring structure 112P may be configured as a conductive post. The wiring structure 112P may be disposed on a first surface S1 of an interconnect structure 140, may penetrate at least a portion of a first encapsulant 131, and may electrically connect a redistribution pattern 142P to a backside wiring layer 132. The wiring structure 112P may form an electrical path penetrating the first encapsulant 131. The conductive post may include a conductive material. The conductive post may be completely filled with a conductive material, and may have a cylindrical shape or a polygonal pillar shape, for example. A shape of the conductive post is not limited to any particular example, and may have various shapes. In FIG. 21, the wiring structure 112P may be connected to the redistribution pattern 142P and the backside wiring layer 132 through a redistribution via 143V and a backside via 133. Differently from the example illustrated in FIG. 21, when a lower surface of the wiring structure 112P is exposed from a lower surface of the first encapsulant 131 by a planarization process, the wiring structure 112P may be directly connected to the backside wiring layer 132, that is without an intervening backside via 133.

The elements in FIG. 21 and in FIG. 1 having the same reference numerals are similar elements, and thus, the detailed descriptions thereof will not be provided.

Figure 22:
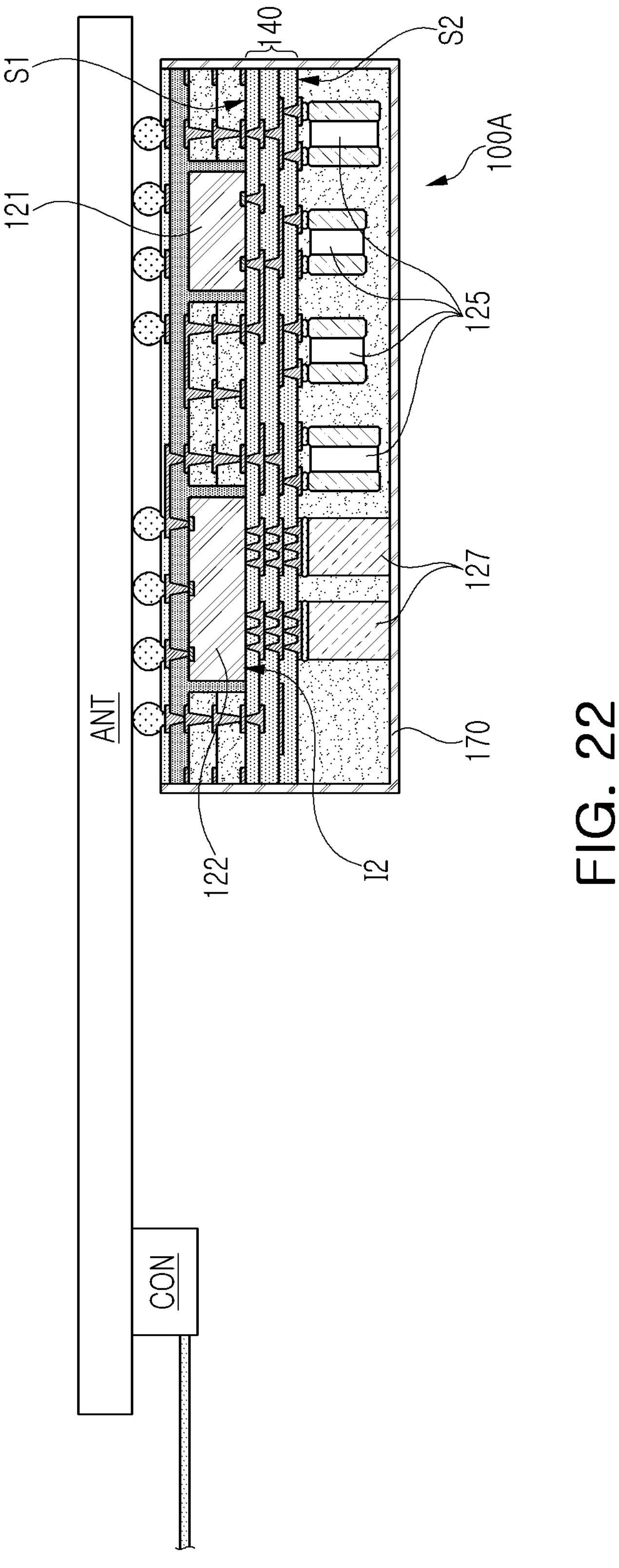
FIG. 22 is a cross-sectional diagram illustrating a state in which the semiconductor package illustrated in FIG. 1 is mounted on an antenna substrate.

FIG. 22 is a cross-sectional diagram illustrating a state in which a semiconductor package is mounted on an antenna substrate.

Referring to FIG. 22, a semiconductor package 100A described in the example embodiment and a connector CON may be disposed one surface of an antenna substrate ANT. As a plurality of passive components 125 and semiconductor chip 121 and 122 may be disposed on both surfaces S1 and S2 of an interconnect structure 140, respectively, a mounting area of the semiconductor package 100A on the antenna substrate ANT may be reduced. Also, heat from the package 100A may be effectively emitted through a heat dissipation member 127 connected to a second inactive surface 12 of the second semiconductor chip 122 and an external shielding layer 170 connected to the heat dissipation member 127. The connector CON may be connected to a coaxial cable, a flexible PCB (FPCB), or the like, when the antenna substrate ANT is disposed in a set in which the package 100A is mounted, and the connector CON may provide a physical and/or electrical connection path with the other elements provided in the set.

According to the aforementioned example embodiments, by disposing a plurality of semiconductor chips on one surface of an interconnect structure and disposing a heat dissipation member on the other surface of the connection structure, a semiconductor package having a reduced size and improved heat dissipation performance may be provided.

While the example embodiments have been shown and described above, it will be apparent to those skilled in the art that modifications and variations could be made without departing from the scope of the present inventive concept as defined by the appended claims.

What is claimed is:

1. A method of manufacturing of a semiconductor device, the method comprising:

mounting a first semiconductor chip and a second semiconductor chip on a film, the first semiconductor chip comprising a first active surface facing the film, a first connection pad on the first active surface, and a first inactive surface opposing the first active surface, the second semiconductor chip comprising a second active surface, a second connection pad on the second active surface, and a second inactive surface opposing the second active surface and facing the film;

forming a first encapsulant covering the first and second semiconductor chips on the film;

forming an interconnect structure on the first active surface and on the second inactive surface after removing the film, the interconnect structure comprising a redistribution pattern and a vertical connection conductor;

mounting a passive component on the redistribution pattern and mounting a heat dissipation member on the vertical connection conductor; and forming a second encapsulant covering the passive component and the heat dissipation member on the interconnect structure.

2. The method of claim 1, further comprising:

forming an external shielding layer on at least a portion of an exterior surface of each of the second encapsulant, the interconnect structure, and the first encapsulant, after the forming the second encapsulant, wherein an upper surface of the heat dissipation member is in contact with the external shielding layer.

3. The method of claim 1, wherein the vertical connection conductor comprises a plurality of heat dissipation patterns disposed on different levels and a plurality of heat dissipation vias connected to the plurality of heat dissipation patterns.

4. The method of claim 3, wherein the heat dissipation member includes a plurality of heat dissipation members corresponding to the plurality of heat dissipation patterns, respectively, wherein at least one of the plurality of heat dissipation members does not vertically overlap the second semiconductor chip.

5. The method of claim 3, wherein the plurality of heat dissipation vias are integrated with corresponding heat dissipation patterns of the plurality of heat dissipation patterns, respectively.

6. The method of claim 3, wherein a thickness of an uppermost heat dissipation pattern of the plurality of heat dissipation patterns, which is directly connected to the heat dissipation member, is greater than a thickness of each of other heat dissipation patterns of the plurality of heat dissipation patterns, which are on at least one level that is lower than the uppermost heat dissipation pattern, and wherein a level is defined as a distance from a height of the second active surface of the second semiconductor chip to a height of a corresponding configuration.

7. The method of claim 3, wherein a width of an uppermost heat dissipation via of the plurality of heat dissipation vias, which is connected to an uppermost heat dissipation pattern of the plurality of heat dissipation patterns, is greater than a width of each of other heat dissipation vias of the plurality of heat dissipation vias, which are on at least one level lower than the uppermost heat dissipation via, and wherein a level is defined as a distance from a height of the second active surface of the second semiconductor chip to a height of a corresponding configuration.

8. The method of claim 3, wherein a lowermost heat dissipation via of the plurality of heat dissipation vias is directly connected to the second inactive surface.

9. The method of claim 3, wherein the interconnect structure comprises a plurality of redistribution layers on different levels and a plurality of redistribution via layers connected to the plurality of redistribution layers, wherein the redistribution pattern comprises a plurality of redistribution patterns on different levels, and wherein the plurality of redistribution layers comprise the plurality of heat dissipation patterns and the plurality of redistribution patterns.

10. The method of claim 9, wherein the plurality of heat dissipation patterns are formed by a same deposition process as the plurality of redistribution patterns.

11. The method of claim 9, wherein the plurality of heat dissipation patterns are spaced apart from the plurality of redistribution patterns.

12. The method of claim 1, further comprising:

forming a frame on the film before the mounting the first semiconductor chip and the second semiconductor chip, wherein the frame comprises an insulating layer, a wiring structure, a first through-hole in which the first semiconductor chip is provided, and a second through-hole in which the second semiconductor chip is provided, and wherein the wiring structure is electrically connected with the redistribution pattern.

13. The method of claim 12, further comprising:

forming a backside wiring layer on the first encapsulant and a backside via penetrating the first encapsulant, wherein the backside wiring layer and the backside via electrically connect the wiring structure and the second connection pad.

14. The method of claim 1, wherein the second semiconductor chip is directly connected to the vertical connection conductor.

15. The method of claim 1, wherein a height of the heat dissipation member is greater than a height of the passive component, relative to the interconnect structure.

16. A method of manufacturing of a semiconductor device, the method comprising:

mounting a semiconductor chip on a film, the semiconductor chip comprising an active surface, a connection pad on the active surface, and an inactive surface opposing the active surface and facing the film;

forming a first encapsulant covering the semiconductor chip on the film;

forming an interconnect structure on the inactive surface after removing the film, the interconnect structure comprising a redistribution pattern, and a vertical connection conductor;

mounting a heat dissipation member on the vertical connection conductor;

forming a second encapsulant covering the heat dissipation member on the interconnect structure, and forming an external shielding layer on at least a portion of an exterior surface of the second encapsulant, the external shielding layer contacting with an upper surface of the heat dissipation member.

17. The method of claim 16, wherein the redistribution pattern comprises a plurality of redistribution patterns on different levels, and wherein the vertical connection conductor comprises a plurality of heat dissipation patterns each having a same level as each of the plurality of redistribution patterns.

18. The method of claim 17, wherein the plurality of redistribution patterns are electrically connected with the connection pad and the plurality of heat dissipation patterns are spaced apart from the plurality of redistribution patterns and isolated electrically.

19. The method of claim 16, further comprising:

attaching the first encapsulant on a carrier before forming the interconnect structure, the active surface of the semiconductor chip facing the carrier, and removing the film.

20. A method of manufacturing of a semiconductor device, the method comprising:

forming a frame on a film, the frame comprising an insulating layer, a wiring structure, a first through-hole, and a second through-hole, mounting a first semiconductor chip in the first through-hole and a second semiconductor chip in the second through-hole on the film, the first semiconductor chip comprising a first active surface facing the film, a first connection pad on the first active surface, and a first inactive surface opposing the first active surface, the second semiconductor chip comprising a second active surface, a second connection pad on the second active surface, and a second inactive surface opposing the second active surface and facing the film;

forming a first encapsulant covering the first and second semiconductor chips on the film;

forming an interconnect structure on the first active surface and on the second inactive surface after removing the film, the interconnect structure comprising a redistribution pattern electrically connecting with the wiring structure, and a vertical connection conductor;

forming a backside wiring layer on the first encapsulant, the backside wiring layer connected with the second connection pad and wiring structure;

mounting a passive component on the redistribution pattern and mounting a heat dissipation member on the vertical connection conductor; and forming a second encapsulant covering the passive component and the heat dissipation member on the interconnect structure.

* * * * *